United States Patent
Daniel et al.

(10) Patent No.: US 9,306,597 B1
(45) Date of Patent: Apr. 5, 2016

(54) DATA COMPRESSION

(71) Applicant: Microsoft Technology Licensing, LLC, Redmond, WA (US)

(72) Inventors: Andrew David Daniel, Palo Alto, CA (US); Michael Fenton, Palo Alto, CA (US); Andrew Dean Payne, Mountain View, CA (US); John Peter Godbaz, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/673,145

(22) Filed: Mar. 30, 2015

(51) Int. Cl.
*H03M 7/34* (2006.01)
*H03M 7/30* (2006.01)

(52) U.S. Cl.
CPC ........................................ *H03M 7/60* (2013.01)

(58) Field of Classification Search
CPC ........... H03M 7/00; H03M 7/30; H03M 5/00; H03M 13/09; H03M 7/3088; H03M 13/6343; H03M 7/4006; H03M 1/18; H03M 7/3068; H03M 7/6005
USPC ............................. 341/50, 51, 55, 59, 94, 107
See application file for complete search history.

(56) References Cited

U.S. PATENT DOCUMENTS

| | | | |
|---|---|---|---|
| 4,855,742 A * | 8/1989 | Verboom | H03M 5/145 341/102 |
| 5,511,095 A | 4/1996 | Inoue et al. | |
| 5,767,909 A | 6/1998 | Jung | |
| 5,812,071 A | 9/1998 | Kairouz | |
| 5,819,215 A | 10/1998 | Dobson et al. | |
| 5,850,565 A | 12/1998 | Wightman | |
| 5,867,114 A | 2/1999 | Barbir | |
| 6,747,580 B1 * | 6/2004 | Schmidt | H03M 5/145 345/106 |
| 6,747,644 B1 | 6/2004 | Deering | |
| 6,973,128 B2 * | 12/2005 | Zhou | H04N 21/2662 375/240 |
| 7,119,721 B2 | 10/2006 | Coene | |
| 7,929,640 B2 | 4/2011 | Smith et al. | |
| 8,284,082 B2 * | 10/2012 | Rao | H04N 19/172 341/51 |
| 8,462,023 B2 * | 6/2013 | Kim | H03M 7/30 341/106 |
| 8,562,750 B2 * | 10/2013 | Chen | C23C 16/0245 134/1.2 |

(Continued)

OTHER PUBLICATIONS

Rane, at el., "Systematic Lossy Forward Error Protection for Error-Resilient Digital Video Broadcasting", In Proceedings of International Conference on Image Processing, vol. 5, Oct. 10, 24, pp. 588-595.

(Continued)

*Primary Examiner* — Linh Nguyen
(74) *Attorney, Agent, or Firm* — Greg Wisdom; Judy Yee; Micky Minhas

(57) ABSTRACT

Data compression is described herein. The encoder transmits a coded word having replacement bits, as well as a code that defines the starting location of the replacement bits in a data sample. The replacement bits may be actual bits from a selected location in the new data sample. The selected location of the replacement bits can vary from data sample to data sample. The encoder may select the location based on the most significant bit that has changed. Thus, reconstructed data will be bit-accurate from the replaced bits all the way to the highest-order bit. A limited number of key values can be transmitted losslessly. Moreover, the data compression does not need forward error correction (FEC), which is a necessary part of many lossy delta encoding schemes. Furthermore, the encoding and decoding can be done very efficiently in terms of hardware and/or software.

20 Claims, 20 Drawing Sheets

(56) References Cited

U.S. PATENT DOCUMENTS

| | | | |
|---|---|---|---|
| 8,660,177 B2* | 2/2014 | Huang | H03M 7/4006 375/240.02 |
| 8,768,899 B2 | 7/2014 | Faerber et al. | |
| 2002/0044074 A1* | 4/2002 | St. George | H03M 7/30 341/76 |
| 2009/0278715 A1* | 11/2009 | Fenney | H03M 7/4006 341/51 |
| 2010/0295713 A1* | 11/2010 | Ueno | H03M 7/4006 341/87 |
| 2013/0018856 A1* | 1/2013 | Pedersen | H03M 7/30 707/693 |
| 2014/0098857 A1 | 4/2014 | MacInnis et al. | |
| 2014/0269909 A1 | 9/2014 | Oh et al. | |

OTHER PUBLICATIONS

Tian, Jun, "Reversible Data Embedding Using a Difference Expansion", In Proceedings IEEE Transactions on Circuits and Systems for video technology, vol. 13, No. 8, Aug. 2003, pp. 890-896.

* cited by examiner

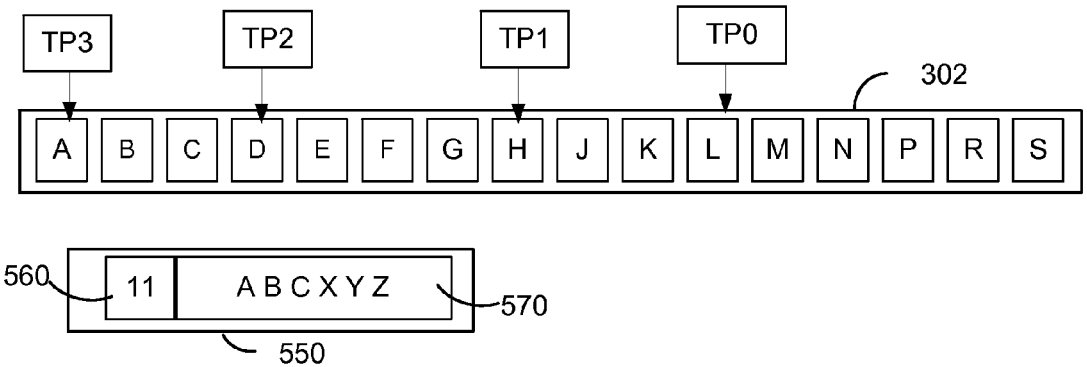

FIG. 12A

Send compressed word for a data sample, 1201

↓

1202 Should special symbol should be transmitted? —No→ Normal encoding

↓Yes

Access code for the special symbol ("s" bits), 1204

↓

Tap point is TP3, 1206

↓

Access the "m-s" most significant bits from previous data sample, 1208

↓

Form the compressed word that comprises a code for TP3, the "m-s" most significant bits from previous data sample, and the "s" bits for the code for the special symbol, 1210

↓

Send compressed word that comprises a code for the tap point and the overlay, 1212

FIG. 12B

DATA COMPRESSION

BACKGROUND

There are many techniques for data compression. Some techniques can produce very high levels of compression and very little loss. Many data compression techniques require forward error correction. For example, some delta coding techniques work well with relatively little hardware, but require forward error correction to avoid decompression errors accumulating over time.

SUMMARY

Data compression in electronic systems is described herein. The encoder of one embodiment transmits a coded word having replacement bits, as well as a code that defines the starting location of the replacement bits in a data sample. The replacement bits are the bits from a selected location in the new data sample. The selected location of the replacement bits can vary from data sample to data sample. The encoder may select the location based on the most significant bit that has changed relative to a prior data sample. Thus, reconstructed data may be bit-accurate all the way from the highest-order bit to the lowest-order of the replaced bits. This may alleviate the need for forward error correction. The data compression may be lossy. However, a limited number of key values can be transmitted losslessly. As noted, the data compression may not need forward error correction (FEC), which is a necessary part of many lossy delta encoding schemes. Furthermore, the encoding and decoding can be done very efficiently in terms of hardware and/or software.

One embodiment is a system that includes the following. The system has a first interface that is operable to access a first data sample having "n" bits ordered from a most significant bit to a least significant bit, as well as a second data sample having "n" bits ordered from a most significant bit to a least significant bit, wherein the second data sample is the next data sample after the first data sample in an ordered sequence of data samples. The system has first logic that is operable to determine the highest-order bit, if any, that is different between the first data sample and the second data sample. The system has second logic that is operable to determine a tap point that is a specific bit of the "n" bits. The tap point is one of a number of permitted starting points for an overlay of "m" bits. The tap point corresponds to a bit whose order is at least as high as the highest-order bit that is different between the first and second data samples. The tap points are positioned such that all "n" bits fall within at least one overlay. The system has third logic that is operable to access a portion of the second data sample comprising "m" contiguous bits. The portion starts at the tap point and includes bits towards the least significant bit. The portion is an overlay for the second data sample. The third logic is further operable to form a compressed word for the second data sample that comprises the portion of the second data sample in association with a code that indicates the tap point. The system has a second interface that is operable to output the compressed word for the second data sample.

One embodiment is a method that includes the following. An encoder accesses a first data sample having "n" bits ordered from a most significant bit to a least significant bit, as well as a second data sample having "n" bits ordered from a most significant bit to a least significant bit, wherein the second data sample is the next data sample after the first data sample in an ordered sequence of data samples. The encoder determines the highest-order bit that is different between the first data sample and the second data sample. The encoder selects a tap point that is a specific bit of the "n" bits. The tap point is one of a number of permitted starting points for an overlay of "m" bits. The tap point corresponds to a bit whose order is at least as high as the highest-order bit that is different between the first and second data samples. The tap points are arranged such that all "n" bits fall within at least one overlay. The overlay is "m" bits. The encoder accesses a contiguous portion of the second data sample that starts at the tap point and moves towards the least significant bit. The contiguous portion is an "m" bit overlay for the second data sample. The encoder provides a compressed word for the second data sample to a decoder. The compressed word comprises the contiguous portion of the second data sample in association with a code that indicates the tap point.

One embodiment is an apparatus comprising the following. The apparatus has decoder logic that is operable to receive a compressed word for a first data sample from an encoder and to decompress the first data sample to produce a decompressed first data sample. The decoder logic is further operable to receive a compressed word for a second data sample from the encoder, wherein the second data sample is the next data sample after the first data sample in an ordered sequence of data samples. The compressed word for the second data sample comprises a code for a tap point for the second data sample and "m" contiguous bits of the second data sample. The first and second data samples, when decoded, each have "n" bits ordered from a most significant bit to a least significant bit. The tap point is a specific bit of the "n" bits. The tap point is one of a number of permitted starting points for an overlay of "m" bits. The tap point corresponds to a bit whose order is at least as high as the highest-order bit that is different between the first and second data samples. The tap points are positioned such that all "n" bits fall within at least one overlay. The decoder logic is operable to access the tap point and overlay from the compressed word for the second data sample. The decoder logic is operable to determine a start point for the overlay for the second data sample based on the tap point. The decoder logic is operable to replace "m" bits in the decoded version of the first data sample starting at the start point for the overlay for the second data sample with the "m" contiguous bits of the second data sample from the compressed word for the second data sample in order to generate a decoded version of the second data sample. The decoder logic is operable to output the decoded version of the second data sample.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 12A is a diagram of a data sample and compressed word to illustrate one embodiment of encoding a special symbol.

FIG. 12B is a flowchart of one embodiment of encoding a special symbol.

DETAILED DESCRIPTION

Figure 1:
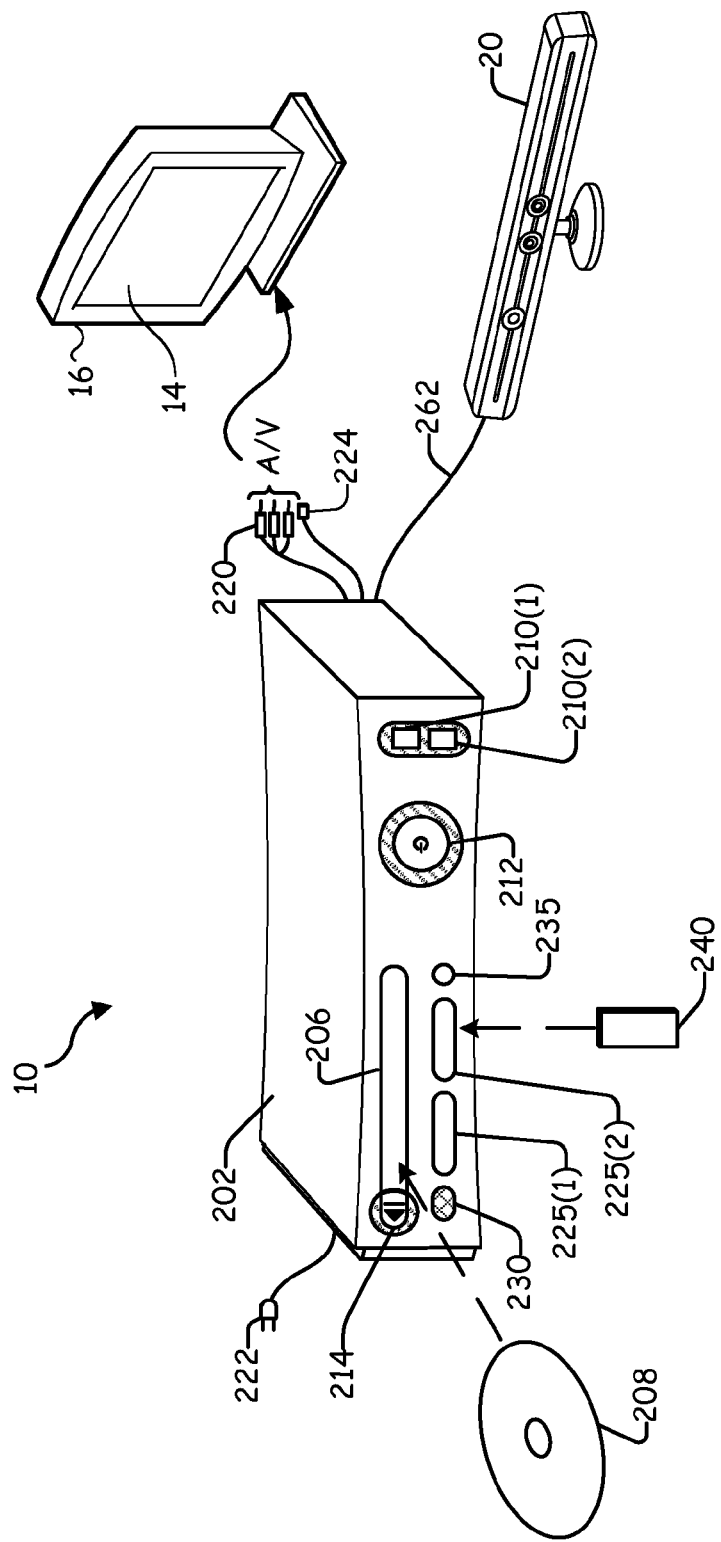
FIG. 1 show an exemplary environment in which embodiments may be practiced.

Embodiments disclosed herein provides for Floating Overlay Compression ("FOC"). In one embodiment, the encoder assumes that the data samples are ordered from a most significant bit to a least significant bit. In one embodiment, the compressed data for a new data sample that is sent from the encoder to the decoder includes an "overlay" and a code that indicates a bit location at which the overlay starts. The overlay is a small contiguous segment of the new data sample that, at least in some cases, includes the highest-order bit that changed between the new data sample and the immediately preceding data sample. The overlay starts at either the location of the highest-order changed bit, or a more significant bit. Therefore, the decoder may use the overlay to replace certain bits in the previously decoded data sample. This results in a decoded version of the new data sample.

In one embodiment, reconstructed data will be bit-accurate from the replaced bits all the way to the highest-order bit. However, bits lower-order than the replaced bits might not be accurate. In one embodiment, the overlay is used to transmit a bit that changed between two prior samples, but was not accurately reconstructed in the second of those two prior samples. That is, the changed bit is not a change in the new sample relative to the immediately previous sample. This is referred to below as a "ripple embodiment." This ripple embodiment allows even the lower-order bits to be accurate after a delay of just one or a few data samples.

The term overlay may be used because FOC works by transmitting replacement bits for the most significant bits that have changed, rather than the difference values transmitted by some conventional techniques. The term floating may be used because the location of the bits to be replaced can vary from sample to sample. The location of the bits is also transmitted as part of the coded word.

FOC may be considered to be a form of fixed-length delta coding. For example, FOC may transmit differences between successive data samples, wherein the differences typically require fewer bits to transmit than would the entire sample. FOC may be lossy. As noted already, the overlay might not include some lower-order bits that changed. However, since these are lower-order bits, their loss may not be that important. For example, if the data is integer data representing pixel values, the loss of one of the least significant bits does not necessarily lead to significant performance degradation. Moreover, as noted above, a change to the lower-order bits may be transmitted later in a ripple embodiment. In one embodiment, a limited number of key values can be transmitted losslessly.

It is not assumed that FOC will necessarily perform as well as some conventional delta encoding techniques in terms of compression factor. However, the encoding requirements of FOC are simpler. For example, FOC does not need Forward Error Correction (FEC), which is a necessary part of many lossy delta encoding schemes. FEC is required in many lossy delta-encoded schemes because, if the encoder only considers the current and immediately preceding samples, error caused by compression loss at each sample will carry forward to all subsequent samples in the chain. This results in accumulation of errors at each individual step, causing each reconstructed samples to be more error-prone than the preceding sample. Although a well-designed conventional technique will have an average error of zero over time, the localized error can be significant. The error can be especially bad when samples change monotonically over the sample chain, resulting in errors that are all positive or all negative accumulating across the chain.

The encoding and decoding of embodiments disclosed herein can be performed in hardware, software, or some combination thereof. The encoding can be done very efficiently in terms of hardware and/or software. Likewise, the decoding can be done very efficiently in terms of hardware and/or software. The lack of need for Forward Error Correction is one factor that allows the hardware and/or software of the encoder and/or decoder to be simpler.

FIG. 1 show an exemplary environment 10 in which embodiments may be practiced. The exemplary environment 10 includes a computing console (hereinafter "console") 202, a capture device 20, and a display 14. During operation, various data may be compressed for transfer in accordance with embodiments. As one example, the capture device 20 could generate video or depth data, either of which could be compressed and transferred over communication link 262 to the console 202. Any of these data transfers may be wireline or wireless. In some cases, the data transfer does not go external to a device. For example, one component within the console 202 could encode the data and transfer the compressed data to another component within the console 202.

Next, further details of the console 202 will be discussed. The console 202 may include hardware components and/or software components such that console 202 may be used to execute applications such as gaming and non-gaming applications. In one embodiment, console 202 may include a processor such as a standardized processor, a specialized processor, a microprocessor, or the like that may execute instructions stored on a processor readable storage device for performing processes described herein.

Console 202 is equipped with an internal hard disk drive (not shown) and a portable media drive 206 that support various forms of portable storage media, as represented by optical storage disc 208. Examples of suitable portable storage media include DVD, CD-ROM, game discs, and so forth. Console 202 also includes two memory unit card receptacles 225(1) and 225(2), for receiving removable flash-type memory units 240. A command button 235 on console 202 may enable and disable wireless peripheral support.

Console 202 also includes an optical port 230 for communicating wirelessly with one or more devices and two USB (Universal Serial Bus) ports 210(1) and 210(2) to support a wired connection for additional controllers, or other peripherals. In some implementations, the number and arrangement of additional ports may be modified. A power button 212 and an eject button 214 are also positioned on the front face of game console 202. Power button 212 is selected to apply power to the game console, and can also provide access to other features and controls, and eject button 214 alternately opens and closes the tray of a portable media drive 206 to enable insertion and extraction of a storage disc 208.

The console 202 may be connected to an audio/visual device 16 having a display 14. The device 16 may for example be a television, a monitor, a high-definition television (HDTV), or the like that may provide game or application visuals and/or audio to a user. For example, the console 202 may include a video adapter such as a graphics card and/or an audio adapter such as a sound card that may provide audio/visual signals associated with the game or other application. The audio/visual device 16 may receive the audio/visual signals from the console 202 and may then output the game or application visuals and/or audio associated with the audio/visual signals. According to one embodiment, the audio/visual device 16 may be connected to the console 202 via AN cables 220, which may for example be an S-Video cable, a coaxial cable, an HDMI cable, a DVI cable, a VGA cable, a component video cable, or the like.

A power cable 222 provides power to the game console. Console 202 may be further configured with broadband capabilities, as represented by a cable or modem connector 224 to facilitate access to a network, such as the Internet. The broadband capabilities can also be provided wirelessly, through a broadband network such as a wireless fidelity (Wi-Fi) network.

Figure 2:
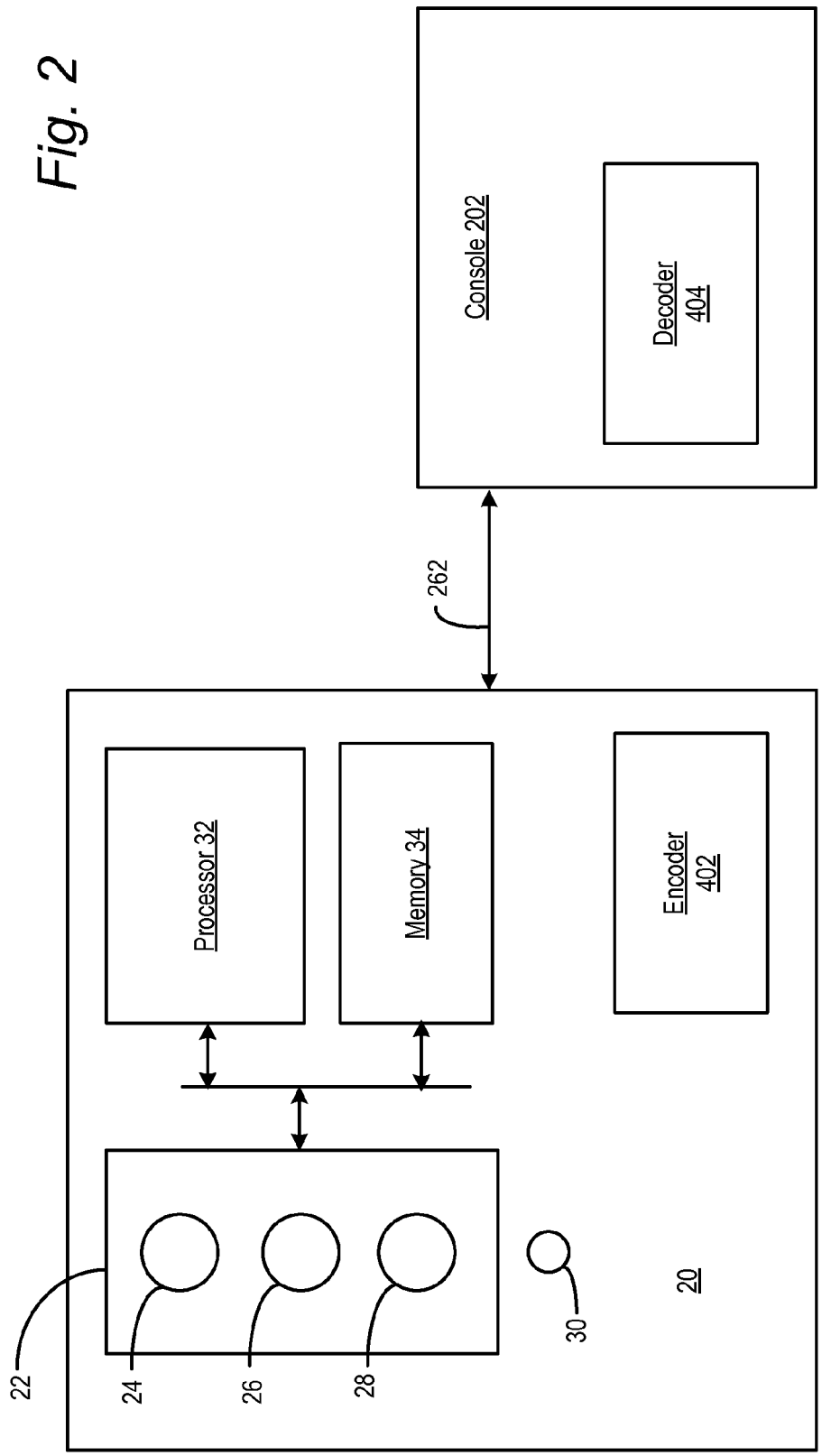
FIG. 2 illustrates further details of an example embodiment of the capture device that may be used in the exemplary environment of FIG. 1.

FIG. 2 illustrates further details of an example embodiment of the capture device 20 that may be used in the environment 10. In one example, the capture device 20 may be configured to capture video having a depth image that may include depth values via any suitable technique including, for example, time-of-flight, structured light, stereo image, or the like. According to one embodiment, the capture device 20 may organize the calculated depth information into "Z layers," or layers that may be perpendicular to a Z axis extending from the depth camera along its line of sight.

As shown in FIG. 2, the capture device 20 may include an image camera component 22. According to an example embodiment, the image camera component 22 may be a depth camera that may capture the depth image of a scene. The depth image may include a two-dimensional (2-D) pixel area of the captured scene where each pixel in the 2-D pixel area may represent a depth value such as a length or distance in, for example, centimeters, millimeters, or the like of an object in the captured scene from the camera.

As shown in FIG. 2, according to an example embodiment, the image camera component 22 may include an Infrared (IR) light component 24, a three-dimensional (3-D) camera 26, and an RGB camera 28 that may be used to capture the depth image of a scene. For example, in time-of-flight analysis, the IR light component 24 of the capture device 20 may emit an infrared light onto the scene and may then use sensors (not shown) to detect the backscattered light from the surface of one or more targets and objects in the scene using, for example, the 3-D camera 26 and/or the RGB camera 28.

In some embodiments, pulsed infrared light may be used such that the time between an outgoing light pulse and a corresponding incoming light pulse may be measured and used to determine a physical distance from the capture device 20 to a particular location on the targets or objects in the scene. Additionally, in other example embodiments, the phase of the outgoing light wave may be compared to the phase of the incoming light wave to determine a phase shift. The phase shift may then be used to determine a physical distance from the capture device 20 to a particular location on the targets or objects.

According to another example embodiment, time-of-flight analysis may be used to indirectly determine a physical distance from the capture device 20 to a particular location on the targets or objects by analyzing the intensity of the reflected beam of light over time via various techniques including, for example, shuttered light pulse imaging.

The capture device 20 may further include a microphone 30. The microphone 30 may include a transducer or sensor that may receive and convert sound into an electrical signal. According to one embodiment, the microphone 30 may be used to reduce feedback between the capture device 20 and the console 202 in the target recognition, analysis, and tracking system 10. Additionally, the microphone 30 may be used to receive audio signals that may also be provided by the user to control applications such as game applications, non-game applications, or the like that may be executed by the console 202.

In an example embodiment, the capture device 20 may further include a processor 32 that may be in operative communication with the image camera component 22. The processor 32 may include a standardized processor, a specialized processor, a microprocessor, or the like that may execute instructions that may include instructions for receiving the depth image, determining whether a suitable target may be included in the depth image, converting the suitable target into a skeletal representation or model of the target, or any other suitable instruction.

The capture device 20 may further include a memory component 34 that may store the instructions that may be executed by the processor 32, images or frames of images captured by the 3-D camera or RGB camera, or any other suitable information, images, or the like. According to an example embodiment, the memory component 34 may include random access memory (RAM), read only memory (ROM), cache, Flash memory, a hard disk, or any other suitable storage component. As shown in FIG. 2, in one embodiment, the memory component 34 may be a separate component in communication with the image camera component 22 and the processor 32. According to another embodiment, the memory component 34 may be integrated into the processor 32 and/or the image camera component 22.

As shown in FIGS. 1 and 2, the capture device 20 may be in communication with the console 202 via a communication link 262. The communication link 262 may be a wired connection including, for example, a USB connection, an IEEE 1394 connection, an Ethernet cable connection, or the like and/or a wireless connection such as a wireless 802.11b, g, a, or n connection. According to one embodiment, the console 202 may provide a clock to the capture device 20 that may be used to determine when to capture, for example, a scene via the communication link 262.

Additionally, the capture device 20 may provide the depth information and images captured by, for example, the 3-D camera 26 and/or the RGB camera 28 to the console 202 via the communication link 262. In one embodiment, the data is compressed by an encoder 402 at the capture device 20, transferred in encoded form over communication link 262 and decoded at the console 202 by a decoder 404. Although not depicted in FIG. 2, the capture device 20 could also have a decoder and the console 202 could also have an encoder.

In one embodiment, the encoder 402 assumes that the most significant bits of each sample are the high-order bits. In one embodiment, the encoder 402 replaces data starting at or above the highest-order changed bits. However, a given encoder 402 embodiment might not permit starting the overlay at all possible bit positions. Therefore, each encoder 402 embodiment specifies a number of tap points at which the overlay may begin. Overlays are contiguous bits starting from the selected tap point toward the low-order bit positions. Tap points are assign in a manner such that all bits are within the range of at least one tap point, in one embodiment. Therefore, a change to any bit can be encoded.

Figure 3:
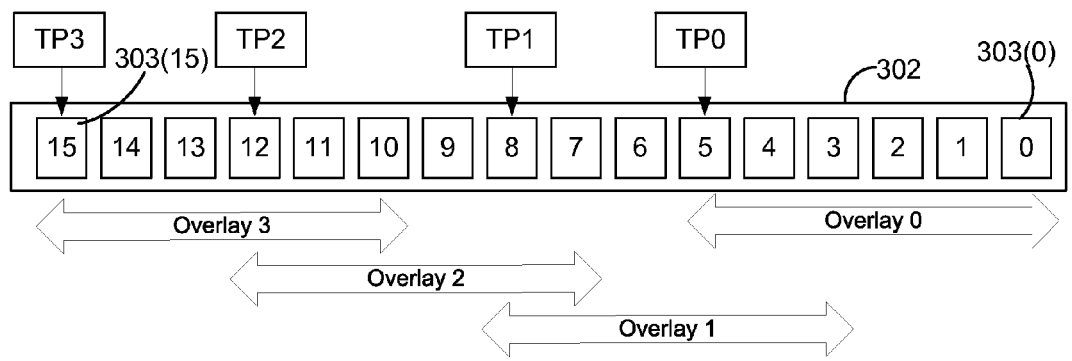
FIG. 3 shows a 16 bit data sample that is suitable for one embodiment of data compression.

FIG. 3 will be referred to illustrate one embodiment. FIG. 3 shows a 16 bit data sample 302. The bits are ordered in increasing significance from a most significant bit (e.g. 303 (15)) to a least significant bit (e.g., 303(0)). In this example, the bits are labeled 15, 14, 13, . . . 0 from the most significant bit (MSB) to the least significant bit (LSB).

Four available overlays are shown (Overlay 0, Overlay 1, Overlay 2, Overlay 3). Each overlay covers six contiguous bits in the data sample 302. In this example, the 16-bit sample 302 is assigned four tap points (TP0, TP1, TP2, TP3). Note that all 16 bits are within the range of at least one tap point. For example, bits 15 through 10 are in the range of overlay 3, bits 12 through 7 are in the range of overlay 2, buts 8 through 3 are in the range of overlay 1, and bits 5 through 0 are in the range of overlay 0. Since there are four available tap points, two bits will be used to encode the tap point. For purpose of discussion throughout this disclosure, the coding will be (00, 01, 10, 11) for TP0, TP1, TP2, TP3, respectively. Since there are six bits of overlay and two bits for the encoded tap point, the encoded sample result will always be eight bits in this example.

There may be more or fewer than four tap points. The overlay may include more or fewer than six bits. The sample size is not required to be 16 bits. In one embodiment, there are a limited number of tap points that are in use at one time. Thus, there are a limited number of permitted starting points for the overlays of "m" each bits to be used for a given encoded sample. However, the tap points are arranged such that all "n" bits fall within at least one overlay.

In one embodiment, the following relationship in Equation 1 holds for input data samples each having "n" bits, an overlay of "m" bits, and an encoded tap point of "e" bit(s). Note that the tap point may be encoded in one or more bits.

$$(2^e \times m) \geq n \qquad (1)$$

Figure 4:
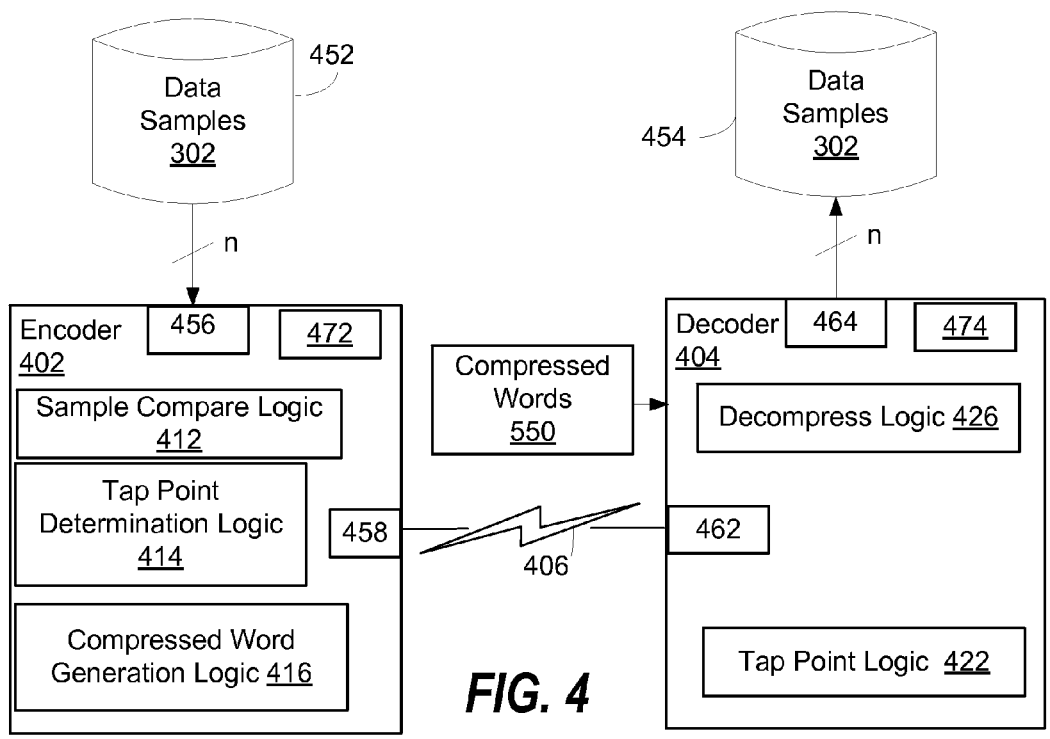
FIG. 4 depicts one embodiment of an encoder and a decoder.

FIG. 4 depicts one embodiment of an encoder 402 and a decoder 404. The encoder 402 inputs data samples 302, compresses them, and outputs compressed data samples 550. In this example, the encoder 402 inputs data samples 302 from memory 452 using interface 456.

The compressed data samples 550 may be referred to herein as "compressed words" or as "encoded data samples." A communication link 406 between the encoder 402 and the decoder 404 is used to transfer the encoded (or compressed) data samples 550. The communication link 406 could be wireline or wireless.

The encoder 402 has sample compare logic 412, tap point determination logic 414 and compressed word generation logic 416. The encoder 402 has an interface 456 that accesses data samples that each comprise "n" bits in uncompressed format. The "n" bits of each data sample 302 may be ordered in decreasing significance from a most significant bit to a least significant bit. Moreover, the data samples 302 may be ordered sequentially. As one example, each data sample 302 could represent a pixel, wherein there is a spatial sequence between the pixels. As another example, each data sample 302 could be audio data, wherein there is a temporal sequence between the audio data samples. The encoder 402 has storage 472 that may be used to store previously accessed data samples 302, as well as other information.

The data samples 302 could have a variety of formats. As one example, the data samples 302 are integer data. The most significant bit of the data samples 302 might indicate a sign (e.g., positive or negative). This sign may indicate whether an integer is positive or negative. As one example, the data samples 302 may have a twos complement format. Another example is sign and exponent format. For example, the most significant bit could be the sign of the value being represented in the mantissa. Several bits may be used for the exponent. The exponent may be stored at the next most significant bits after the sign. Remaining lower-order bits are the mantissa.

The sample compare logic 412 is configured to perform a comparison of two data samples 302. In one embodiment, this is a logical comparison, as opposed to a mathematical comparison, for example. As one example, the sample compare logic 412 performs a bit by bit comparison. In one embodiment, the logic 412 determines the highest-order bit that is different between two data samples.

The tap point determination logic 414 is configured to determine a tap point for the newest data sample 302.

The compressed word generation logic 416 is configured to generate a compressed word 550 for the newest data sample 302. In one embodiment, logic 416 accesses a portion of the newest data sample 302 comprising "m" contiguous bits, wherein "m" is the size of the overlay. Logic 416 generates the compressed word 550 from code for the tap point and the "m" bit overlay. In one embodiment, the compressed word 550 includes a code that specifies the tap point and some selected bits of the newest data sample. The selected bits of the newest data sample may be referred to as the overlay. In one embodiment, the encoder 402 operates in compliance with Equation 1 above. In this case, the tap point is specified by a code of "e" bits, and the overlay is "m" bits of the newest data sample.

The decoder 404 receives the compressed word 550 from the encoder 402 over the communication link 406. The decoder 404 has interface 462 to access the compressed word 550 from the communication link 406. The decoder 404 decodes the compressed word 550 and outputs decompressed data samples using interface 464. The decompressed data samples 302 depicted as being stored in memory 454.

The decoder 404 comprises tap point logic 422 and decompress logic 426. The tap point logic 422 is configured to determine how the tap point in the compressed word 550 should be used to modify a previously decoded data sample based on the overlay for the newest data sample. The decoder 402 has storage 474 that may be used to store a previously decoded data sample, as well as other information.

The decompress logic 426 is configured to take the overlay in the compressed word 550 and use it to modify the previous data sample to generate a decoded version of the new data sample. The tap point logic 422 works with the decompress logic 426 to replace the proper bits in the previous sample with the overlay.

The various logic within the encoder 402 and/or decoder 404 may be implemented with hardware, software, or some combination of hardware and software. For example, some of the logic could be implemented with gates that implement Boolean logic such as OR, NOR, XOR, AND, NAND, etc. Some of the logic could be implemented with a hardware implemented priority encoder. Some of the logic could be implemented within a System on Chip (SoC). The various interfaces 456, 458, 462, 464 could be a wide variety of interfaces, such as a USB controller, I/O controller, network interface, etc.

Figure 13:
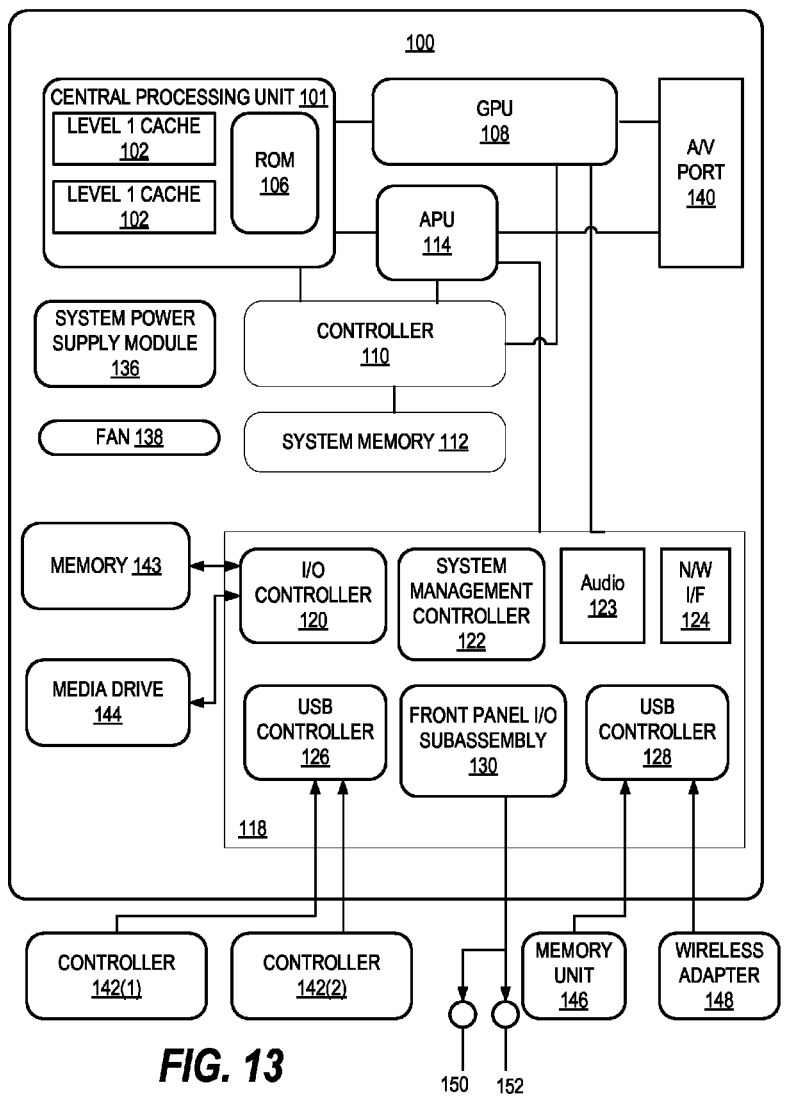
FIG. 13 is a block diagram of a computing system that can be used to implement components and perform methods of the disclosed technology.

Any or all of the logic within the encoder 402 and/or decoder 404 could be implemented by executing instructions on a processor. For example, referring back to FIG. 2, the encoder 402 could be implemented at least in part by executing instructions that are stored in memory 34 on the processor 32. Similar reasoning applies to the decoder 404. Similar reasoning applies to other devices that have an encoder 402 and/or decoder 404. FIG. 13 shows one example computing system in which the encoder 402 and/or decoder 404 could be implemented.

Referring back to the example of FIG. 1, the console 202 or capture device 20, could include the encoder 402 and/or the decoder 404. In some cases, during operation, the encoder 402 of one of the devices provides the compressed words to the decoder 404 of another one of the devices. For example, the encoder 402 of capture device 20 provides compressed words to decoder 404 of the console 202. However, one possibility is for the encoder 402 of, for example, the console 202 to provide the compressed words to the decoder 404 of the console. Similar reasoning applies to the capture device 20 and display 14. Also note that the various devices 14, 20, 202 depicted in FIG. 1 are just one example environment. The encoder 402 and/or the decoder 404 are not limited to those devices.

Figure 5A:
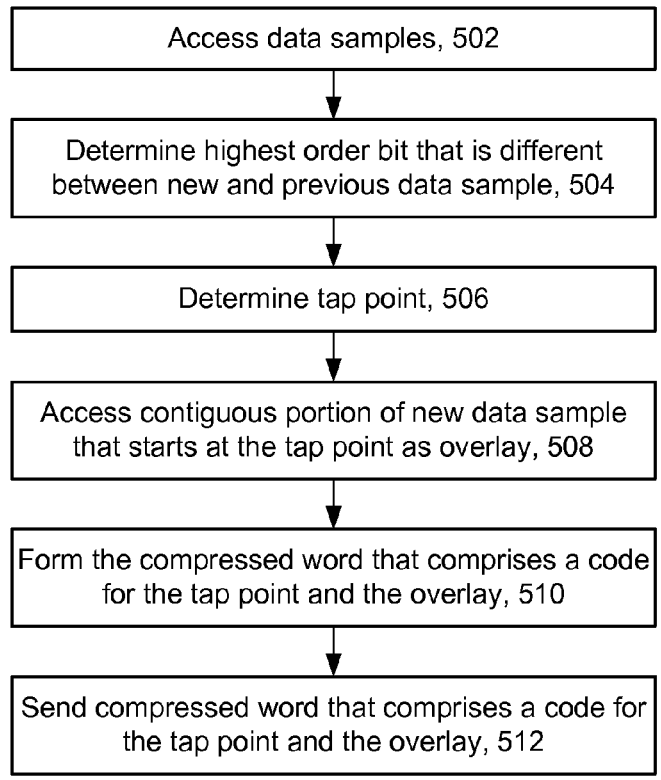
FIG. 5A is a flowchart of one embodiment of a process of encoding data samples.
Figure 5B:
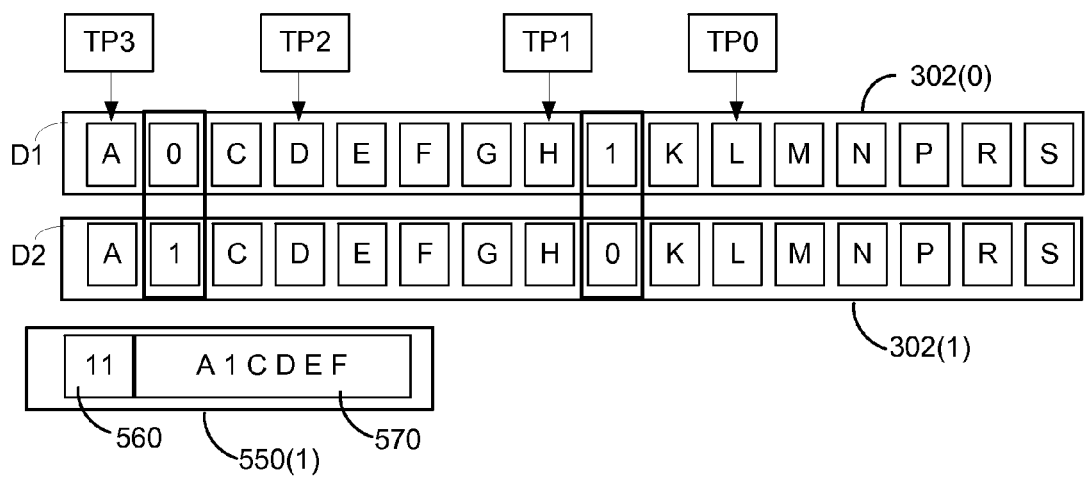
FIG. 5B depicts an example of two data samples to help illustrate the process of FIG. 5A.

FIG. 5A is a flowchart of one embodiment of a process of encoding data samples. The process may be performed by the encoder 402. FIG. 5B depicts an example of two data samples that will be used to help illustrate the process. The steps are depicted in a certain order as a matter of convenience for discussion.

In step 502, the encoder 402 accesses data samples. The encoder 402 may access the data samples 302 from memory 452 using interface 456 (see FIG. 4). The encoder 402 may have local storage 472 for at least temporarily storing previously accessed data samples. As noted above, the data samples 302 may have a format including, but not limited to, integer, two's compliment, and sign and exponent. These accessed data samples have some continuous order in one embodiment. For example, if the data samples are spatially related, then two consecutive data samples may be for data that is physically adjacent. For example, the two data samples may be for pixels that are physically adjacent. As one particular example, these could be two adjacent pixels on a display screen. As another particular example, these could be two adjacent pixels of an image sensor of a camera.

In step 504, the encoder 402 determines the highest-order bit, if any, that is different between the newest data sample and the previous data sample. Note that the newest data sample is the next data sample after the previous data sample in an ordered sequence of data samples. FIG. 5B shows a previous data sample (D1) and a new data sample (D2). Each data sample has 16 bits. In this example, the encoder 402 assumes that the bits are ordered from a most significant bit to a least significant bit. This example is consistent with the example of FIG. 3, in which the data sample has 16 bits, ordered from a most significant bit (e.g., bit 15) to a least significant bit (e.g., bit 0). Additionally, the location of the four tap points TP0, TP1, TP2, and TP3 are the same as in FIG. 3. Note that the selection of the number and location of the tap points is a design decision.

In FIG. 5B, letters of the English alphabet are used to represent bit values when the actual value is irrelevant as long as all instances of any given letter represent the same bit value of 0 or 1. Throughout this description the letters, "I", "O", and "Q" will not be used. For purpose of explanation, the bit numbers 0-15 shown in FIG. 3 will be used when discussing FIG. 5B. Thus, bit 15 refers to the most significant bit (labeled as "A") and bit 0 refers to the least significant bit (labeled as "S"). There are only two bits that are different between the two data samples (D1, D2). At bit 7, the value has changed from "1" to "0". At bit 14, the value has changed from "0" to "1". There has been no change between the two data samples 302(0), 302(1) for any other bits. In the example of FIG. 5B, the encoder 402 determines that the highest-order bit that is different between the two samples is bit 14.

In step 506, the encoder 402 determines a tap point for the new data sample. In one embodiment, the encoder 402 selects the lowest tap point whose associated overlay includes the highest-order bit that is different between the two samples. If no bits have changed, then the lowest overlay may be selected. In one embodiment, the selected tap point corresponds to a bit whose order is at least as high as the highest-order bit that is different between the two data samples.

In the present example, if the highest-order bit that is different between the two samples is any of bits 5 through 0, then TP0 is selected. Also, if there are no bit differences, then TP0 is selected. If the highest-order bit that is different between the two samples is any of bits 8 through 6, then TP1 is selected. If the highest-order bit that is different between the two samples is any of bits 12 through 9, then TP2 is selected. If the highest-order bit that is different between the two samples is any of bits 15 through 13, then TP3 is selected. Referring to FIG. 5B, the encoder 402 determines that tap point TP3 is the tap point for the new sample, since bit 14 is the highest-order bit that is different between the two samples.

In step 508, the encoder 402 accesses a portion of the new data sample that comprises "m" contiguous bits. Here, "m" is the size of the overlay. The contiguous portion starts at the tap point and includes bits towards the least significant bit. This serves as the "m" bit overlay. The overlay may be some fixed number of bits. Referring to FIG. 3 to illustrate, if the tap point is TP0, then bits 5 to 0 are accessed. If the tap point is TP1, then bits 8 to 3 are accessed. If the tap point is TP2, then bits 12 to 7 are accessed. If the tap point is TP3, then bits 15 to 10 are accessed. Referring to FIG. 5B, the encoder 402 accesses bits 15 to 10 are accessed of the new sample (D2).

In step 510, the encoder 402 forms the compressed word for the new data sample. The compressed word comprises a code for the tap point, as well as the overlay for the new data sample. Referring to FIG. 5B, the compressed word 550(1) comprises the code "11" for tap point TP3 and the six most significant bits of the new data sample (D2). The overlay is six bits in this example, but could be a different number of bits.

In step 512, the encoder 402 sends the compressed word over a communication link 406 to the decoder 404. Note that any change that may have occurred at any of bits 15 down to 10 has been conveyed to the decoder 404 in this compressed word 550(1). Thus, there is not any data loss at least for the most significant six bits, in this example. Also note that whenever a lower tap point is able to be selected, then even more bits will be accurate. For example, referring back to FIG. 3, if tap point TP2 had been selected then bits 15 down to 7 will be accurate. This could occur when bits 12 through 7 are included as overlay data, and bits 15 through 13 did not change between the two most recent data samples.

However, there could potentially be at least some temporary data loss at less significant bits. For example, in this example, the information regarding the change at bit 7 has not yet been conveyed to the decoder 404. An example will next be discussed below on how this change to bit 7 may be conveyed in the compressed word for a later data sample.

Figure 6A:
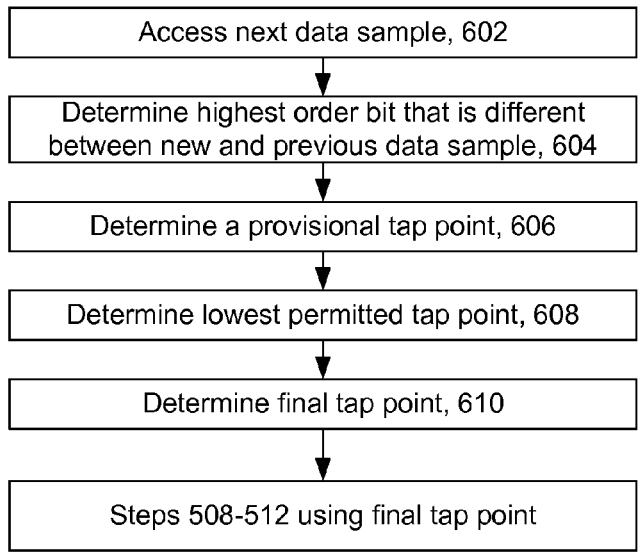
FIG. 6A is a flowchart of one embodiment of a process that is used to send changes to bits that were not previously sent.
Figure 6B:
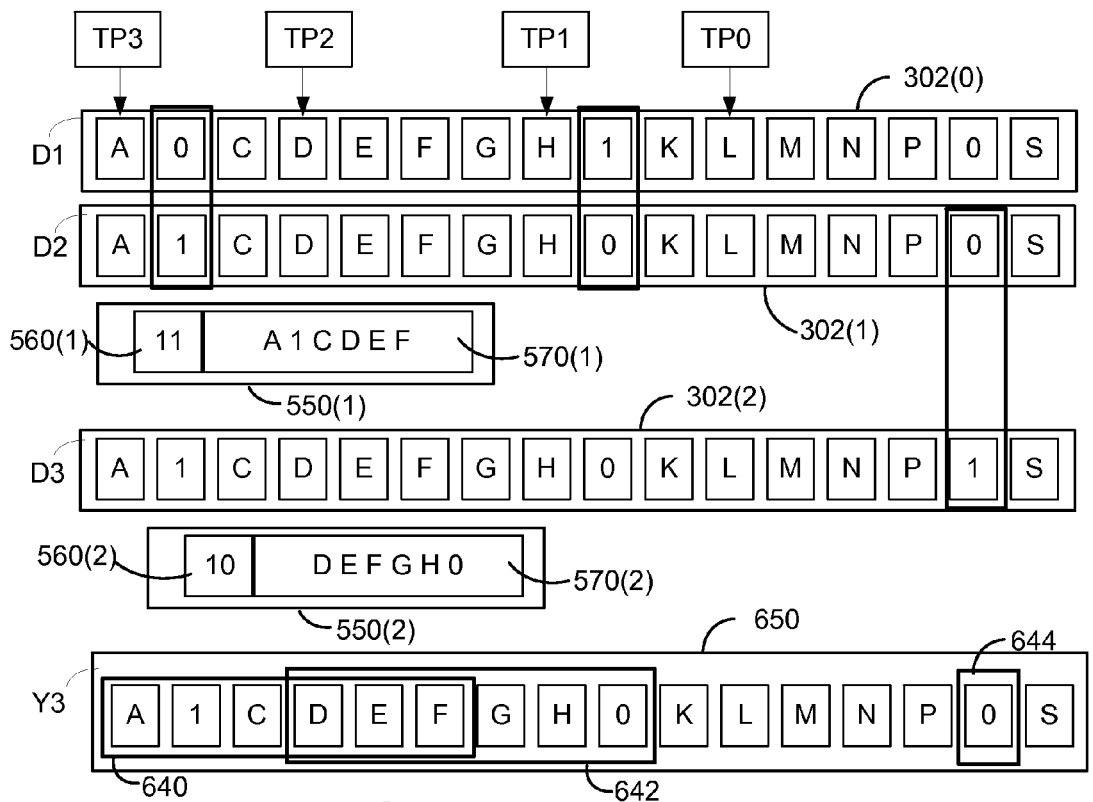
FIG. 6B is a diagram that illustrates processing to help illustrate the process of FIG. 6A.

FIG. 6A is a flowchart of one embodiment of a process that is used to send changes such as the previously mentioned change to bit 7. FIG. 6B is a diagram that illustrates processing of the previously discussed data samples 302(0), 302(1) as well as the next data sample 302(2). To facilitate discussion, an example of processing data sample 302(2) will be discussed. The process may be performed by the encoder 402. The steps are depicted in a certain order as a matter of convenience for discussion.

In step 602, the encoder 402 accesses the next data sample. This next data sample may be the next data sample in an ordered sequence of data samples. This next data sample may be spatially adjacent to the last data sample. For example, data sample 302(2) may be the pixel data for a pixel that is physically next to the pixel represented by data sample 302(1). As another example, the next data sample may be temporally adjacent to the last data sample. For example, data sample 302(2) may be the next data sample in time relative to data sample 302(1).

In step 604, the encoder 402 determines the highest-order bit that is different between the newest data sample and the previous data sample. FIG. 6B shows a previous data sample (D2) and a new data sample (D3). The only bit that is different between the two data samples (D3, D2) is located at bit 1. At bit 1, the value has changed from "0" to "1". There has been no change between the two data samples (D2, D3) for any other bits. Thus, in step 604, the encoder 402 determines that the highest-order bit that is different between the two samples is bit 1.

In step 606, the encoder 402 determines a provisional tap point for the new data sample. This is similar to step 506 of FIG. 5A, but is a provisional tap point in that it may change later in the process. Referring to FIG. 6B, the encoder 402 determines that tap point TP0 is the provisional tap point for the new sample (D3). Note that, assuming a six bit overlay, the overlay for TP0 will include the changed bit between D2 and D3.

In step 608, the encoder 402 determines a lowest permitted tap point for the new data sample. A reason for this step is to allow the previously mentioned difference at bit 7 between data samples D1 and D2 to be transmitted in a compressed word. Note that to simplify the design of the encoder 402, the encoder does not need to remember that the difference at bit 7 between data samples D1 and D2 was not transmitted in the compressed word (during the process of FIG. 5A). It is not a requirement that the encoder 402 does not store such information. However, the following describes a technique that is suitable whether or not the encoder 402 stores such information.

Since the encoder 402 need not store any information about the change at bit 7 between D1 and D2, the encoder 402 can simply assume that it is possible that there might have been a change below the overlay for D2. Referring to FIG. 6B, the overlay 570(1) for D2 covered bits 15 to 10 (i.e., A, 1, C, D, E, F). This means that there was possibly a change between D1 and D2 below bit 10 (which is represented by "F" in FIG. 6B). Tap point TP2 is the lowest tap point that could be selected such that any bit below bit 10 is included in the overlay. Therefore, the encoder 402 determines that tap point TP2 is the lowest permitted tap point. Note that the lowest permitted tap point can be determined based on the last tap point, in conjunction with knowledge of where the tap points are located and the size of the overlay.

Note that in this example, if it were known that bit 7 was the highest-order bit that changed between D1 and D2 and that was not previously conveyed in a compressed word, then tap point TP1 could be selected as the lowest permitted tap point. However, that would require the encoder 402 to remember that bit 7 changed. By not requiring one embodiment of the encoder 402 to remember such information, the design of the encoder 402 is simplified. This could result is less hardware and/or simpler software. For example, the encoder 402 can have less logic such as data latches, gates, etc.

In step 610, the encoder 402 determines a final tap point. This is the highest tap point between the provisional tap point and the lowest permitted tap point. In the example of FIG. 6B, the final tap point is TP2. However, it is possible for the provisional tap point to be higher than the lowest permitted tap point. In this case, the provisional tap point is selected as the final tap point.

The process then continues by employing steps 508-512 from FIG. 5A, using the final tap point. In step 508, the encoder 402 accesses a contiguous portion of the new data sample (D3) that starts at the tap point. This serves as the overlay for data sample D3. Referring to FIG. 6B, the encoder 402 accesses bits 12 to 7 of the new sample (D3). Note that in this example, the overlay includes the data bit that changed between D1 and D2.

In step 510, the encoder 402 forms the compressed word for the new data sample. Referring to FIG. 6B, the compressed word 550(2) comprises the tap point code 560(2) of "10" for tap point TP2. Also, the overlay 570(2) is the bits 12 to 7 (D E F G H 0) of the new data sample (D3). Note that the least significant bit is a "zero" to represent the change from "1" to "0".

In step 512, the encoder 402 sends the compressed word 550(2) over a communication link 406 to the decoder 404. Thus, at this point, bits from 15 through 7 will be accurate. However, bits below bit 7 are not yet guaranteed to be accurate. The process of FIG. 6A may be repeated for the next data sample. Depending on the differences between D3 and D4 this could result in the tap point for D4 being TP1. The process of FIG. 6A may be repeated for the next data sample. Depending on the differences between D4 and D5 this could result in the tap point for D5 being TP0.

Figure 7:
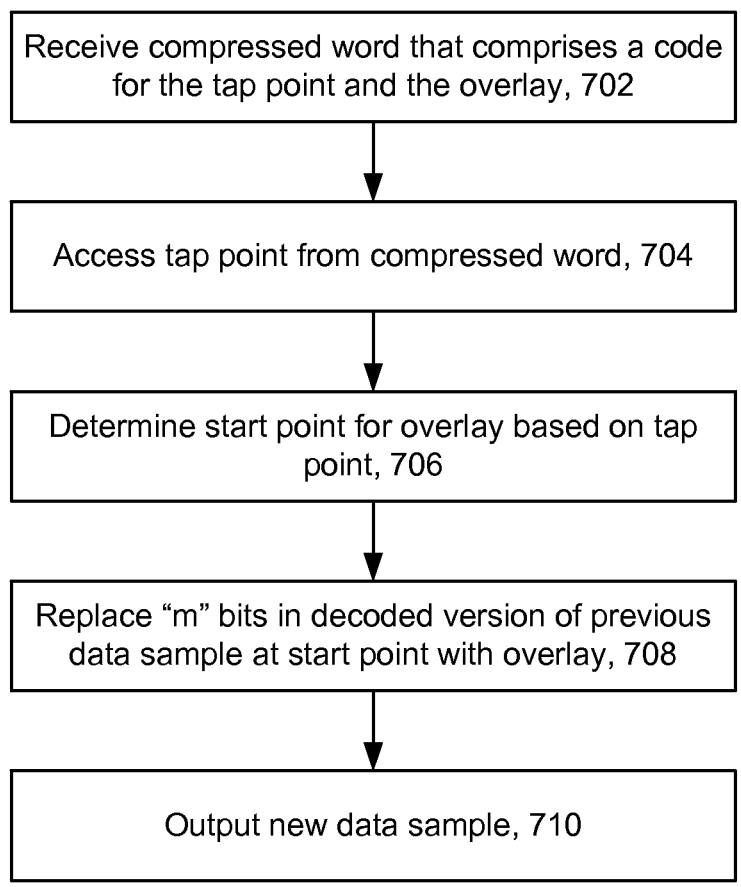
FIG. 7 is a flowchart that shows one embodiment of a process for decoding a compressed word.

FIG. 7 is a flowchart that shows one embodiment of a process for decoding a compressed word. The process may be performed by the decoder 404. The process may be used when the encoder 402 performs the process of FIG. 5A or 6A, as two examples. The steps are depicted in a certain order as a matter of convenience for discussion.

In step 702, the decoder 404 receives a compressed word for a data sample. It will be assumed that the decoder 404 has already received and decoded a previous sample in an ordered sequence of data samples. Thus, for the sake of discussion the decoder 404 has already decoded data sample D1, and is just receiving the compressed word for data sample D2. During this process the decoder 404 will modify the previously decoded data sample D1 in order to generate the decoded version of data sample D2.

In step 704, the decoder 404 accesses the code for the tap point from the compressed word. As discussed above, the code could have "e" bits. For example, a two bit code could be used for tap points TP0, TP1, TP2 and TP3. Referring to the example in FIG. 5B, the decoder 404 accesses the "11" code from the compressed word.

In step 706, the decoder 404 determines a start point for the overlay based on the tap point. The decoder 404 already knows what the starting point is for each of the tap points. For example, at some previous time, the encoder 402 may have sent the decoder 404 the code for each tap point and its associated starting point. Note that the number of tap points, as well as tap point starting points, can be changed, "on-the-fly." It is also possible for the codes for the tap points, as well as their starting points, to be hard-coded in the decoder 404.

In step 708, the decoder 404 replaces "m" contiguous bits in the previously decoded data sample D1 with the overlay that is accessed from the compressed word for data sample D2. Referring to the example in FIG. 5B, the decoder 404 accesses the six overlay bit (A, 1, C, D, E, F) and uses them to replace bits 15 to 10 in the already decoded data sample D1.

In one embodiment, the decoder 404, after replacing the "m" contiguous bits of the previously decoded data sample D1, further replaces all bits of lower order than the overlaid bits with a set of bits intended to reduce the maximum error in the decoded data sample D2. The actual values of bits lower than the replaced bits are not known to the decoder 404. Therefore, by replacing these lower-order bits with a mid-range value, for example, the maximum possible decoding error is minimized. As one example, bits 2 through 0 represent a value of between 0 and 7 unknown to the decoder 404. Therefore, decoding those bits as 100 (binary), which represents a value of 4, limits the largest possible error to 4. It is apparent that 011, which represents a value of 3, also has a maximum possible error of 4.

Knowledge of the distribution of input values and/or the costs of certain types of errors could result in a different setting for the aforementioned lower-order bits below the overlaid bits. In one embodiment, the decoder 404 overwrites the bits below the overlay with zeroes. This assures that the output result will not be higher than the actual value for the data sample.

In step 710, the decoder outputs the decoded data sample D2. Note that at this point, the result is accurate down to bit 10. However, the change at bit 7 has not yet been conveyed to the decoder 404.

The following describes processing of the compressed word for data sample D3. Note that the process of FIG. 7 can simply be used again. Thus, in step 702, the compressed word for D3 is received. FIG. 6B shows the compressed word 570(2) for D3. In step 704, the tap point is accessed from the compressed word. FIG. 6B shows that the tap point code 560(2) is "10". This code is for tap point TP2.

In step 706, the decoder 404 determines the start point for the overlay based on the tap point. In this example, the start point for tap point TP2 is bit 12.

In step 708, the decoder 404 replaces "m" contiguous bits in the decoded version of the previous sample (D2) with the overlay, starting at the tap point. FIG. 6B shows the decoded sample 650. The decoded sample shows region 640, which corresponds to the overlay from sample D2 (the previous sample). The decoded sample shows region 642, which corresponds to the overlay from sample D3 (the new sample). Thus, note that bits 15 to 10 were previously replaced. At this time, bits 12 to 7 are replaced, using overlay 570(2). This means that the decoded data will be accurate from bit 15 down to bit 7. It also means that the previously changed bit between D1 and D2 that was not sent at the time of the original change (bit 7) has now been sent.

However, the changed bit between D2 and D3 has not yet been decoded. Note that at bit 1 of decoded sample 650 in FIG. 6B, the decoded sample has a "0", whereas D3 (see sample 302(2)) has a "1". This change can be "rippled" down by the previously discussed technique used by the encoder 402 in the process of FIG. 6A. Thus, eventually the change at bit 1 can be conveyed to the decoder 404. Note that the decoder 404 does not need to be aware that the encoder 402 performed the process of FIG. 6A to ripple previous changes. This makes for a simple design of the decoder 404.

Figure 8A:
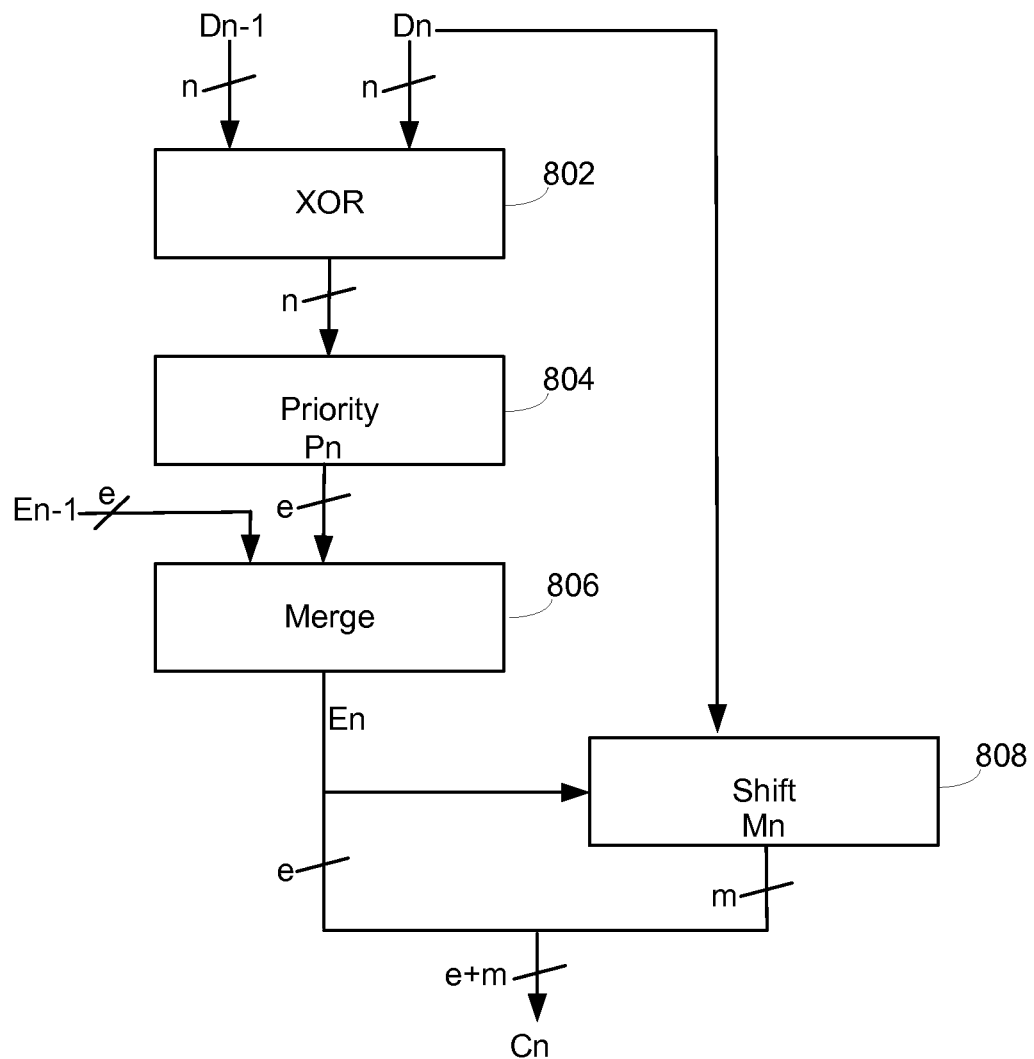
FIG. 8A is a diagram of example logic for implementing one embodiment of the encoder.

FIG. 8A is a diagram of example logic for implementing one embodiment of the encoder 402. The logic can be implemented in hardware, software, or a combination of hardware and software. This example logic is suitable for implementing the process described in FIG. 6A.

The new data sample Dn and the immediately previous data sample Dn−1 are input into XOR logic 802. Each data sample has "n" bits. The XOR logic 802 performs a bitwise logical comparison of each bit and outputs "n" bits to the priority encoder 804. Thus, the XOR logic 802 may be implemented with a set of XOR logic gates. The XOR logic 802 outputs a "1" if the corresponding bits in the two data samples are different, and a "0" otherwise.

The priority encoder 804 examines the "n" bits and determines the highest-order bit that is a "1". The priority encoder 804 (in combination with the XOR 802) determines the highest-order bit that is different between the two input data samples. The priority encoder 804 is configured to output an "e" bit code that represents the region containing the highest input bit that is a "1". The code is referred to as "Pn." The priority encoder 804 may be implemented with a set of logic gates. The following Table I shows one example in binary, in which "e" is two bits. This example is consistent with the example from FIG. 3.

TABLE I

| Highest "1" Position | Pn |
|---|---|
| None | 00 |
| Bit 5 to 0 | 00 |
| Bit 8 to 6 | 01 |
| Bit 12 to 9 | 10 |
| Bit 15 to 13 | 11 |

The priority encoder 804 in effect determines tap point for the new data sample. The tap point for data sample Dn is referred to as Pn. Note that this may be the provisional tap point of step 606 in the embodiment of FIG. 6A. The priority encoder 804 outputs the code for the tap point to the merge logic 806.

The merge logic 806 also inputs the final tap point for the previous data sample. This are referred to as En−1. The merge logic 806 determines the final tap point for the new data sample (Dn). This is referred to as En. The final tap point was discussed in connection with step 610 in FIG. 6A. Recall that the final tap point in that example was determined as the highest tap point between the provisional tap point and the lowest permitted tap point. Also, the lowest permitted tap point can be determined based on the last tap point, in conjunction with knowledge of where the tap points are located and the size of the overlay.

The final tap point (En) is provided to shift logic 808. The shift logic 808 also inputs the new data sample Dn. The shift logic 808 outputs "m" bits, which serve as the overlay for the new data sample Dn.

Finally, the final tap point (En) and the "m" overlay bits are combined to form the compressed word (Cn) for the new data sample Dn.

Figure 8B:
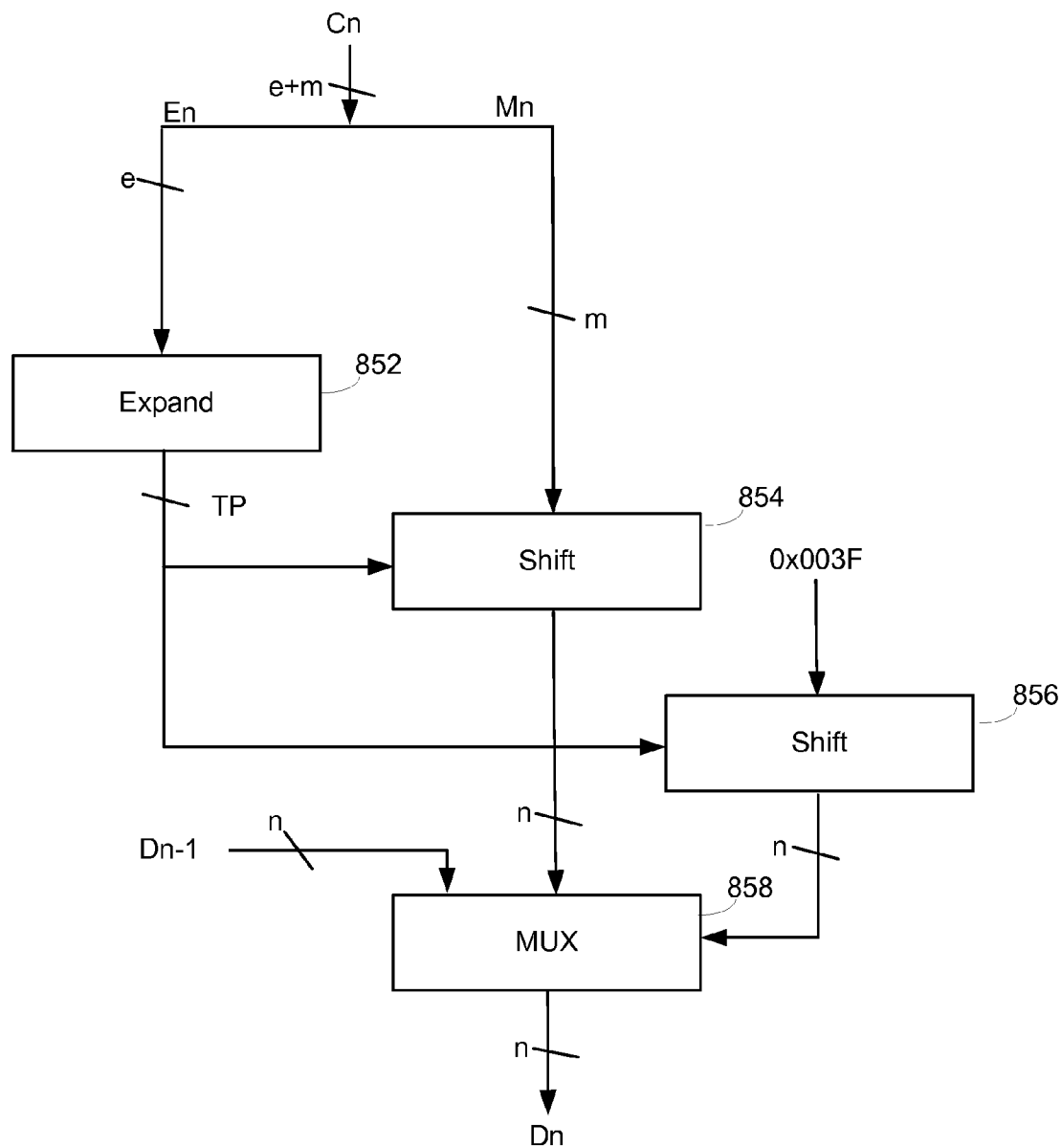
FIG. 8B is a diagram that shows logic for one embodiment of the decoder.

FIG. 8B is a diagram that shows logic for one embodiment of the decoder 404. The logic can be implemented in hardware, software, or a combination of hardware and software. This example logic is suitable for use with the sample encoder logic of FIG. 8A.

The decoder 404 receives the compressed word (Cn) from the encoder 402 as previously discussed. The tap point (En) from the compressed word (Cn) is input to expand logic 852. The tap point is a code that is "e" bits, in this example.

The "m" overlay bits from the compressed word (Cn) are provided to first shift logic 854.

Returning again to discuss the expand logic 852, the expand logic 852 takes the code for the tap point and expands it into a shift value. The shift value is determined based on the bit location of the tap point.

The shift value is provided to both first shift logic 854 and second shift logic 856. The first shift logic 854 inputs the shift value, as well as the "m" overlay bits. The first shift logic 854 outputs "n" bits of data. This data is the "m" overlay bits shifted by the shift amount.

The second shift logic 856 also inputs the shift value, as well as a mask. In this example, the mask is 0x003F. This mask value is consistent with the example of FIG. 3 in which the overlay is six bits (e.g., where m is six bits). The second shift logic 856 outputs an "n" bit mask.

The following Table II shows one example of how the shift value may be used. This example is consistent with the example of FIG. 3. Note that "n" is 16 bits in this example.

TABLE II

| En | Data | Mask |
|----|------|------|
| 00 | .........MMMMMM | 0000 0000 0011 1111 |
| 01 | ......MMMMMM... | 0000 0001 1111 1000 |
| 10 | ...MMMMMM...... | 0001 1111 1000 0000 |
| 11 | MMMMMM......... | 1111 1100 0000 0000 |

The Table II shows four values for the tap point En (which is in binary). The data refers to the 16 bits of data that is output by the first logic 854. The "M" in the data refers to the "m" overlay bits. Note that the "m" overlay bits have been shifted a different amount for each tap point.

The mask in Table II refers to the 16 bit mask that is output by the second logic 856. Again, note that "ones" pattern in the mask shifts by a different amount for each tap point. Also note that there are "m" ones in the mask pattern (in this example, "m" is six).

The MUX 858 inputs the "n" data bits from the first shift logic 854, as well as the "n" bit mask from the second shift logic 856. The MUX 857 also inputs the "n" bits from the last decoded data sample Dn−1. The MUX outputs the decoded value for the new data sample Dn. For example, Dn becomes Dn−1 when decoding the next data sample. Note that only the last stage is rippled, which results in a very thin ripple layer.

The tap points are not required to be at the exact positions depicted in the examples described herein. However, the selection of the tap points may be important to data compression performance. Moreover, the type of data samples may influence the selection of the tap points. In one embodiment, if any two tap points are adjacent, it is possible to infer one bit when the higher-order of the two tap points is selected. If the higher of two adjacent tap points is selected, it can be inferred that the bit at the selected tap point changed. The overlay could be used to update bits starting one bit position to the right of the selected tap point. This effectively provides for an "inferred bit," which does not need to be transmitted. For example, this permits an "m" bit overlay to update "m+1" bits, with the highest order bit inverted and the remaining bits replaced by the overlay.

Figure 9A:
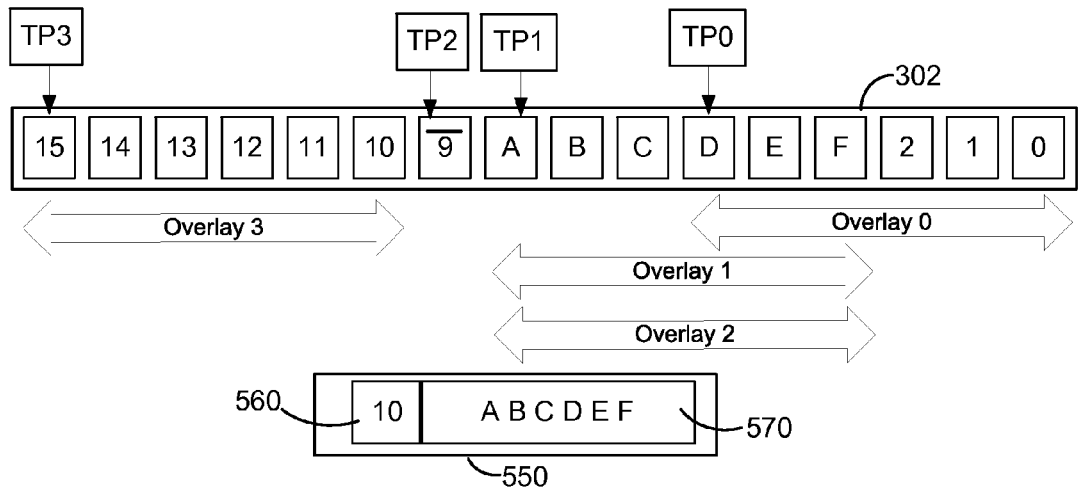
FIG. 9A shows an example that illustrates one embodiment that provides for a free bit.

FIG. 9A shows an example that illustrates one embodiment that provides for an inferred bit. In this embodiment, tap points TP1 and TP2 are adjacent to each other. Note that the overlays for TP1 and TP2 cover the same bits. That is, Overlay 1 and Overlay 2 cover the same bits. When TP2 is the selected tap point, the decoder 404 knows that bit 9 has flipped. Thus, when the decoder 404 receives the depicted compressed word 550 with "10" for the tap point code 560, the decoder 404 knows that bit 9 has flipped and that the overlay 570 should be used to replace bits 8 through 3. Note that this embodiment may be an alternative to the embodiment described with respect to FIG. 3.

Figure 9B:
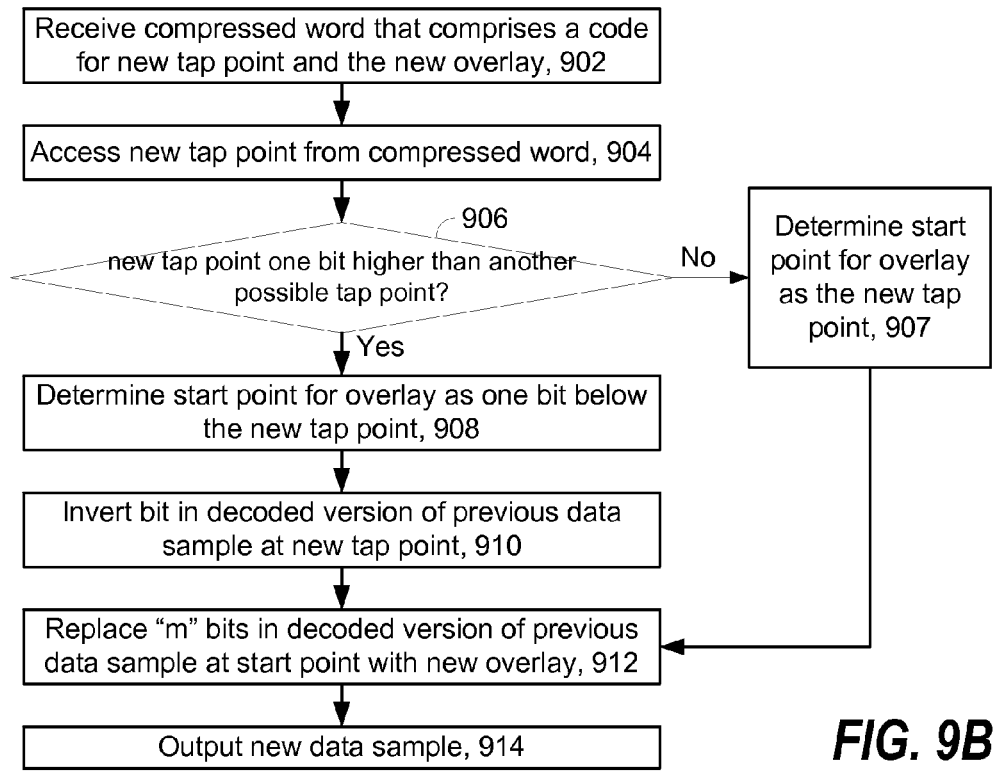
FIG. 9B is a flowchart of one embodiment of decoding that provides for a free bit.

FIG. 9B is a flowchart of one embodiment of decoding that provides for an inferred bit. The process may be performed by the decoder 404 when the encoder 402 encodes using the embodiment described in connection with FIG. 9A. The steps are depicted in a certain order as a matter of convenience for discussion.

In step 902, the decoder 404 receives a compressed word 550 for a data sample 302. It will be assumed that the decoder 404 has already received and decoded an immediately previous data sample in an ordered sequence of data samples. Moreover, for the sake of discussion, the code 560 was code "01", which corresponds to tap point TP1.

In step 904, the decoder 404 accesses the code for the new tap point from the compressed word 550.

In step 906, the decoder 404 determines whether the new tap point is one bit higher than another permitted tap point. In the example of FIG. 9A, the decoder 404 determines whether the new tap point is TP2. If so, the process continues at step 908.

In step 908, the decoder 404 determines a start point for the overlay. The decoder 404 determines that the start point is one bit below the new tap point. For example, the start point is bit 8, referring to FIG. 9A.

In step 910, the decoder 404 inverts a bit at the new tap point in the previously decoded data sample. Referring to the example in FIG. 9A, the decoder 404 would know to invert bit 9.

On the other hand, if the decoder 404 determined in step 906 that the new tap point is not one bit higher than another permitted tap point, then step 907 is performed. In step 907, the start point for the overlay is established as the new tap point.

In step 912, the decoder 404 replaces "m" contiguous bits in the previously decoded data sample with the overlay from the compressed word for the new data sample. Referring to the example in FIG. 9A, the decoder 404 accesses the six overlay bit (A, B, C, D, E, F) and uses them to replace bits 8 to 3 in the previously decoded data sample, in the event that the tap point is TP2. The overlays for other tap points are depicted in FIG. 9A.

In step 914, the decoder outputs the decoded data sample.

In one embodiment, the data samples that are compressed have a two's compliment format. A two's complement number can present a challenge to compress because very small changes around zero may result in changes to the high-order bits, resulting in the inability to correct the low-order bits at all. Although the absolute error is not higher than in other cases, the relative (percentage) error can be extremely high.

Figure 10A:
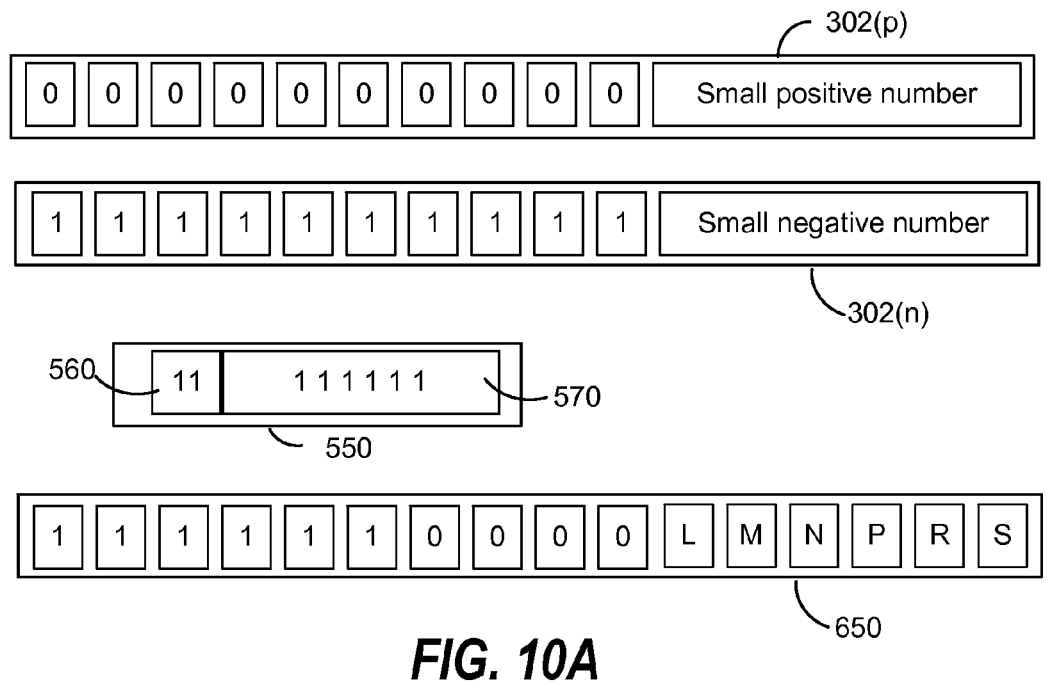
FIG. 10A shows two successive data samples in order to illustrate very small changes for two's compliment.

FIG. 10A will be referred to in order to illustrate. FIG. 10A shows two successive data samples 302(p) and 302(n). Each data sample has a two's complement format. Data sample 302(p) is a small positive number. Data sample 302(n) is a small negative number. Note that there are many high-order bits that have changed between the two samples. The compressed word 550 is one that could be sent if the tap point were chosen at the most significant bit, along with an overlay of the "m" most significant bits. In this example, "m" is six bits. However, this would lead to the decompressed sample 650 having ones in the six most significant bits, followed by zeroes in the next four most significant bits. The least significant bits would remain the same. The result would be that the decoded sample would read incorrectly as a larger negative value than it should.

Although sign-and-magnitude representation may produce somewhat closer results, the least significant bits would again remain the same. A solution of one embodiment is to use sign-and-magnitude representation combined with a technique referred to herein as "floating sign." In a floating sign embodiment, two tap point codes rather than one are assigned to the lowest-order tap point. These codes modify the sign bit and the low-order bits together. Therefore, the encoder 402 does not treat the sign bit as a high-order bit when it is the only high-order to change. In all other cases, the sign bit is treated normally.

Figure 10B:
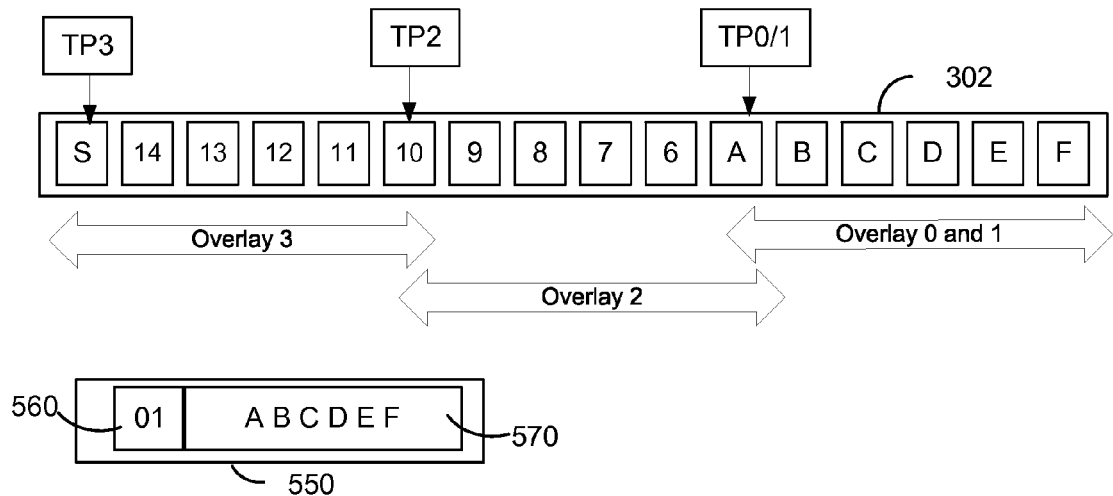
FIG. 10B shows an example to illustrate a floating sign embodiment.

FIG. 10B shows an example to illustrate a floating sign embodiment. The data sample 302 has a sign-and-magnitude format, in this example. The most significant bit is a sign bit (represented as "S"). Note that this data format is different from the two's compliment format of FIG. 10A. Tap points TP0 and TP1 are both at the bit labeled "A". This location is "m–1" bits higher than the least significant bit. To be consistent with other examples herein, "m" is six in this example. However, the overlay can be greater or fewer than six bits. The overlay for each of these tap points covers the six least significant bits. In this example, tap point TP2 is at bit 10, and tap point TP3 is at the most significant bit.

Figure 10C:
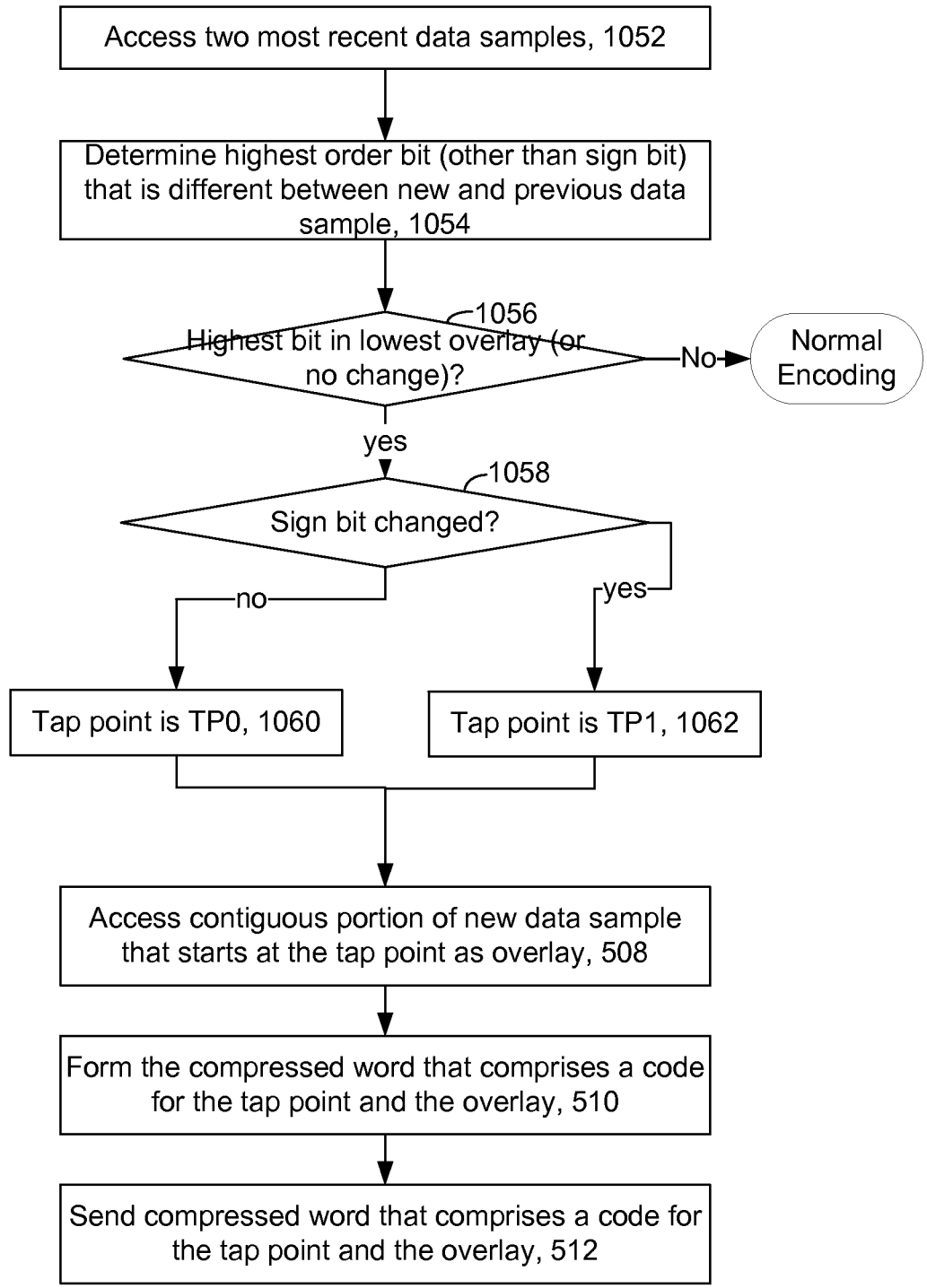
FIG. 10C is a flowchart of one embodiment of a process of floating sign encoding.

FIG. 10C is a flowchart of one embodiment of a process of floating sign encoding. This process may be performed by the encoder 402. This process will be discussed with respect to the example of FIG. 10B for ease of discussion. As noted, the data sample 302 in the example of FIG. 10B has a sign-and-magnitude format. The process can be generalized to a different number and/or location of tap points, different size of overlay, different number of bits in data sample, etc.

In step 1052, the encoder 402 accesses the two most recent data samples in an ordered sequence of data samples. In step 1054, the encoder 402 determines that highest order bit (other than the sign bit) that is different between the two most recent data samples.

If the highest order bit that is different (other than the sign bit) is in the lowest overlay (step 1056=yes), or if there is no change other than the sign bit, then the process continues at step 1058. In this case, the tap point will be either TP0 or TP1.

On the other hand, if the highest order bit that is different is not in the lowest overlay (step 1056=no), then the process performs normal encoding. In this case, the tap point will be either TP2 or TP3. Normal encoding can be performed as discussed in connection with FIG. 5A or 6A, as two examples.

Referring now to the case in which tap point will be either TP0 or TP1, the encoder 402 determines whether the sign bit is different between the two data samples, at step 1058. If the sign bit has not changed, then the encoder 402 selects TP0 as the tap point, in step 1062. If the sign bit has changed, then the encoder 402 selects TP1 as the tap point, in step 1062. The roles of TP0 and TP1 could be reversed.

Next, the process goes on to step 508. Steps 508, 510, and 512 are similar to steps with the same reference number in the process of FIG. 5A. In general, these steps are used to form the compressed word containing the code for the tap point, as well as the contiguous portion of the new data sample that serves as the overlay. The encoder 402 sends the compressed word to the decoder 404 in step 512.

Figure 10D:
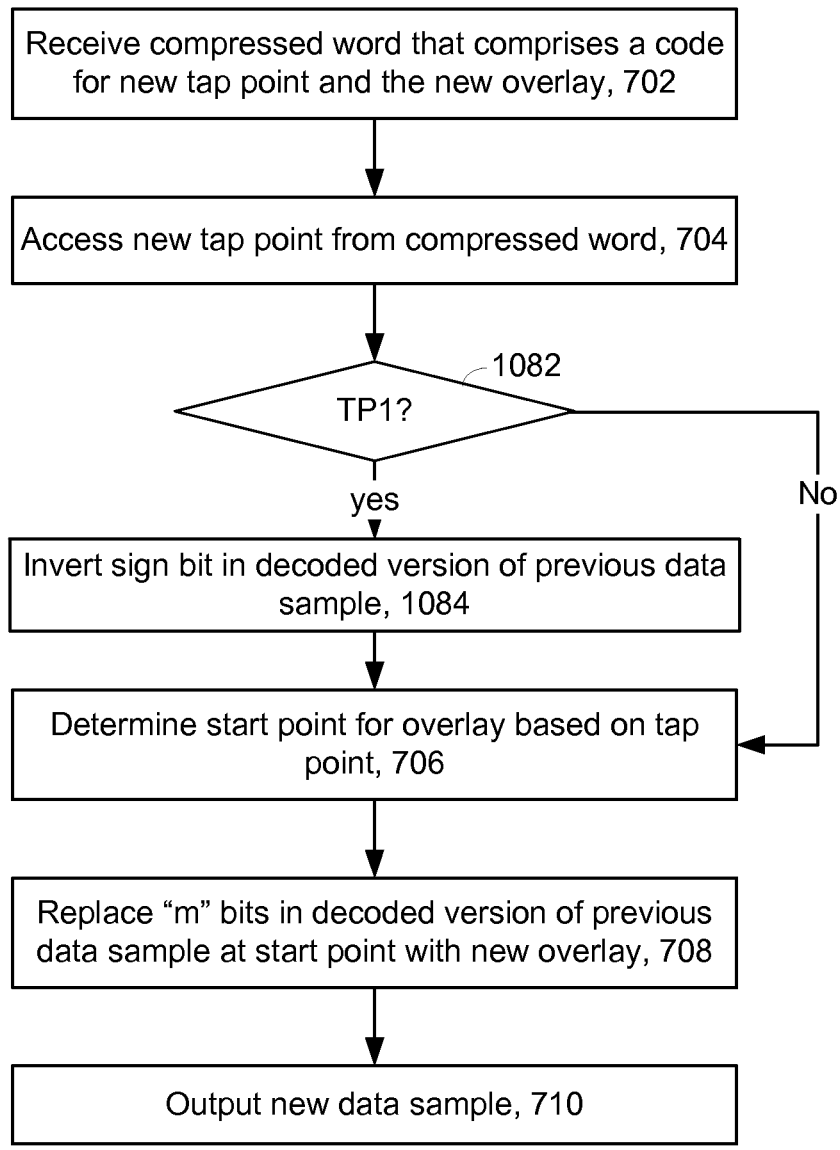
FIG. 10D is a flowchart of one embodiment of a process of floating sign decoding.

FIG. 10D is a flowchart of one embodiment of a process of floating sign decoding. This process may be performed by the decoder 404. This process will be discussed with respect to the example of FIG. 10B for ease of discussion. The process can be used when the encoding was performed using the process of FIG. 10C. The process can be generalized to a different number and/or location of tap points, different size of overlay, different number of bits in data sample, etc. Some steps are similar to the process of FIG. 7, and will use the same reference numbers.

In step 702, the decoder 404 receives a compressed word for a data sample in an ordered sequence of data samples. It will be assumed that the decoder 404 has already received and decoded an immediately previous data sample in the ordered sequence.

In step 704, the decoder 404 accesses the code for the new tap point from the compressed word.

In step 1082, the decoder 404 determines whether the tap point is TP1. In this example, this is a special tap point that indicates that the sign has changed and that any other changes are limited to the low-order bits.

In step 1084, the decoder 404 inverts the sign bit in the decoded version of the previous data sample.

In step 706, the decoder 404 determines a start point for the overlay based on the tap point. In step 708, the decoder 404 replaces "m" contiguous bits in the previously decoded data sample with the overlay from the compressed word for the new data sample. In step 710, the decoder 404 outputs the decoded data sample. Note that processing of tap points TP0, TP2, and TP3 is the same as in the process of FIG. 7.

Figure 10E:
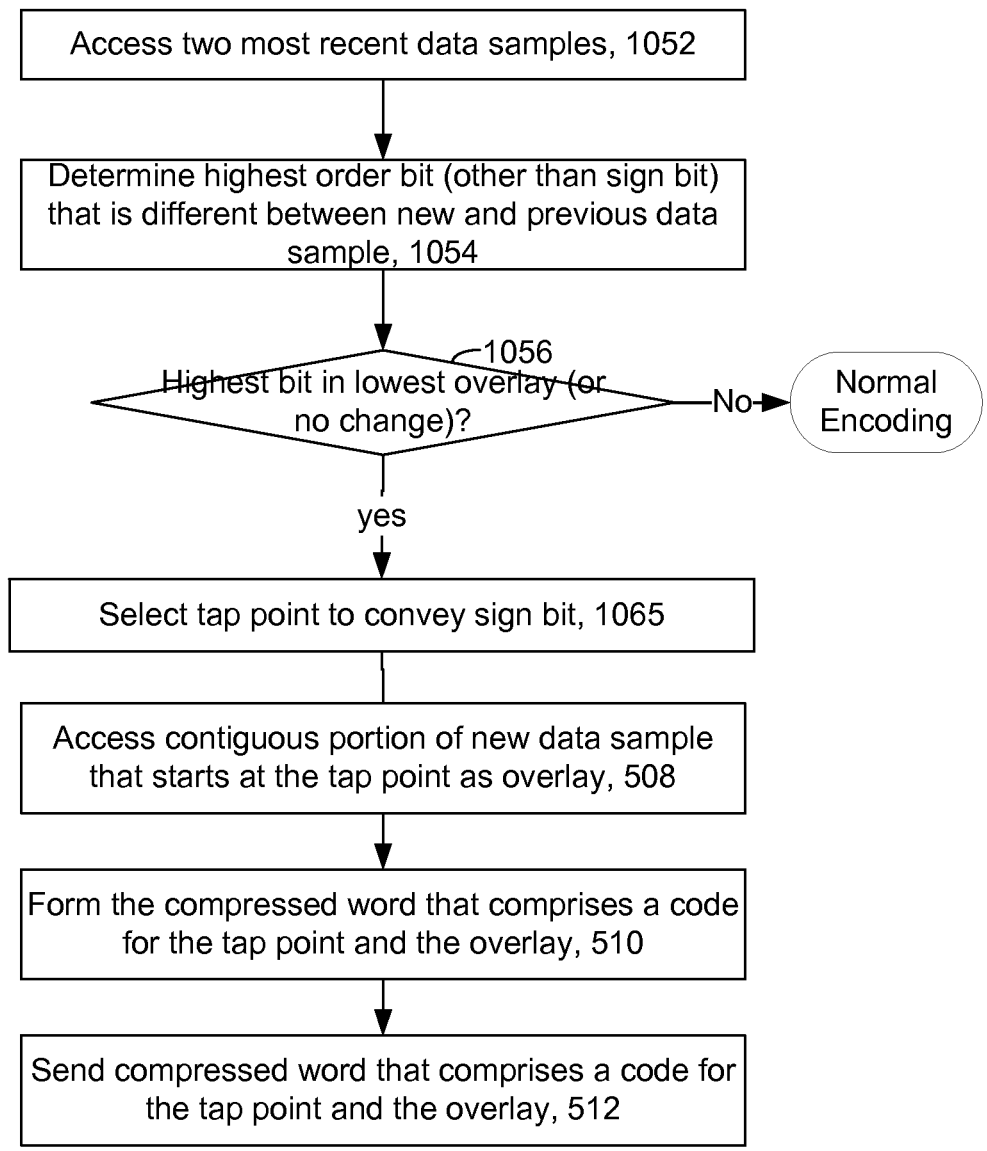
FIG. 10E is a flowchart of an alternative embodiment to that of FIG. 10C.

FIG. 10E is a flowchart of an alternative embodiment to that of FIG. 10C. In the present embodiment, one of the tap points (e.g., TP0) is used to convey that the value of the sign bit in the current data sample is "0". Another of the tap points (e.g., TP1) is used to convey that the value of the sign bit in the current data sample is "1." A difference between this embodiment of that of FIG. 10C is that step 1065 replaces steps 1058-1062. Recall that step 1056 is to determine the triggering condition in which the highest-order bit that has changed (if any), other than the sign bit, is in the lowest overlay. When that occurs step 1065 is performed in which the tap point is selected to convey the sign bit. The encoder 402 may select tap point TP0 when the value of the sign bit in the present data sample is "0." The encoder 402 may select tap point TP1 when the value of the sign bit in the present data sample is "1."

Figure 10F:
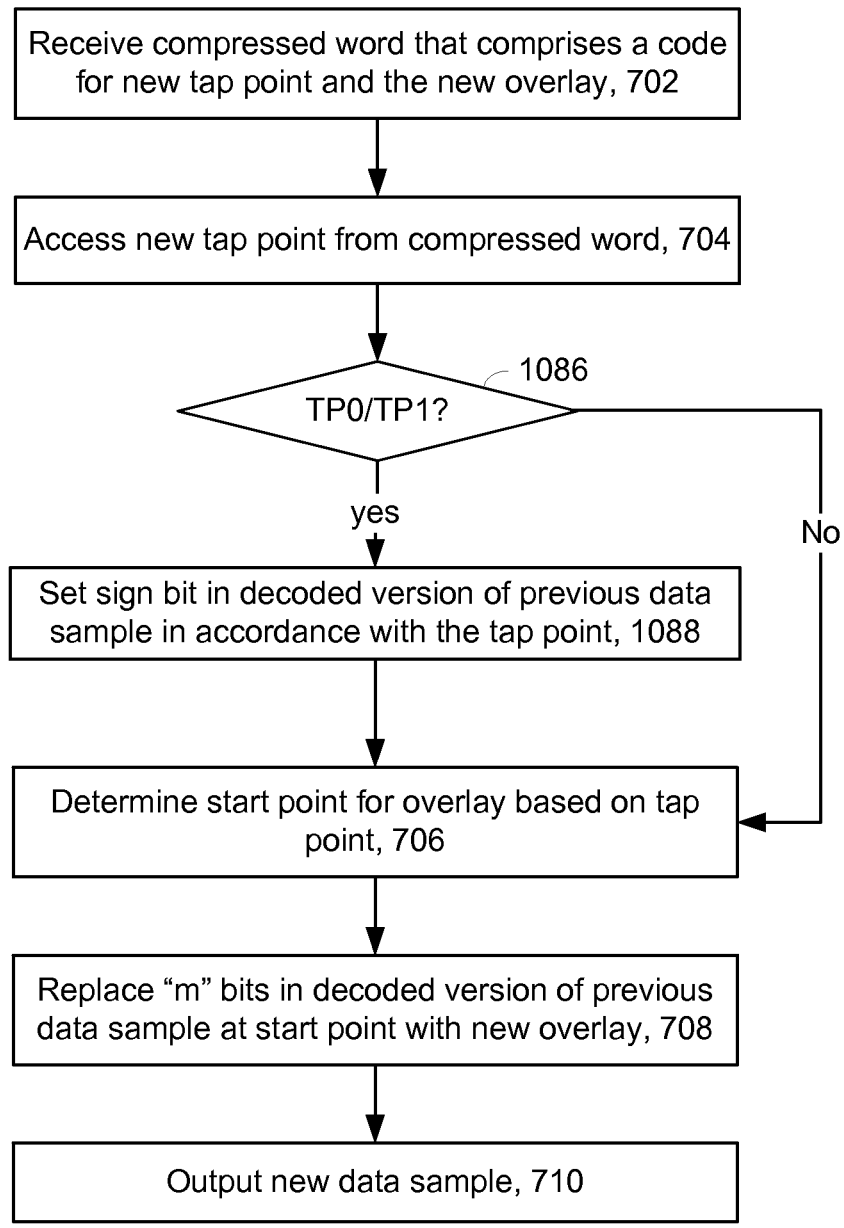
FIG. 10F is a flowchart of an alternative embodiment to that of FIG. 10D.

FIG. 10F is a flowchart of an alternative embodiment to that of FIG. 10D. The decoder 404 may perform the process of FIG. 10F when the encoder 402 performs the process of FIG. 10E. A difference between FIG. 10F and FIG. 10D is that steps 1086 and 1088 replace steps 1082 and 1084. In step 1086, the decoder 404 determines that either tap point TP0 or TP1 is the new tap point. In step 1088, the decoder 404 sets the sign bit in the decoded version of the previous data sample based on the tap point. Using the example from FIG. 10E, the decoder 404 may set the sign bit to "0" when the tap point is TP0. The decoder 404 may set the sign bit to "1" when the tap point is TP1.

Figure 11A:
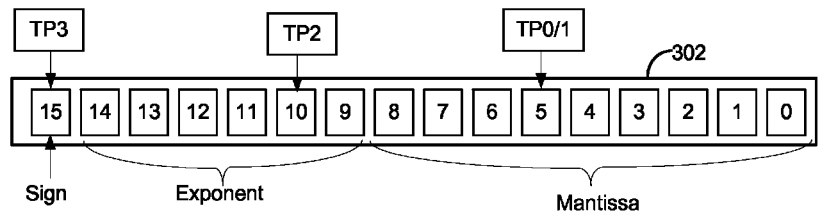
FIG. 11A shows an example of a data sample having a floating point format.

In one embodiment, the data samples that are compressed are floating point numbers. FIG. 11A shows an example of a data sample 302 having a floating point format. The most significant bit is the sign of the value being encoded. Bits 14 through 10 are the exponent. Bits 9 through 0 are the mantissa.

Also depicted are four tap points. As with other examples, an overlay of "m" bits may be associated with each tap point. For example, the overlay could be six bits. Thus, bits 5 through 0 can be replaced by selecting either tap point TP0 or TP1. Bits 10 through 5 can be replaced by selecting tap point TP2. Bits 15 through 10 can be replaced by selecting tap point TP3.

Figure 11B:
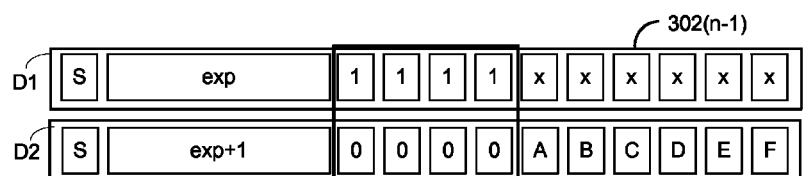
FIG. 11B shows an exponent up straddle case.

Furthermore, bits 15 through 6 are potentially recalculated by the decoder 404 when tap point TP1 is in the compressed word, in one embodiment. Thus, TP1 is a special code that instructs the decoder 404 to implement a complex change. The encoder 402 selects this code when certain conditions are detected. The recalculation may be used to handle what is referred to herein as a "straddle case." A straddle case may occur when there is a small change in a value that causes the sign bit or exponent to change. The straddle case is detected by the encoder 402, which selects the special tap point (in this example TP1). FIGS. 11B, 11BC, and 11D show three examples of straddle cases.

FIG. 11B shows an "exponent up" straddle case. Data sample, 302(n−1) is the previous data sample. Data sample, 302(n) is the new data sample. In this example, the exponent increases by one. Also, the sign bit remains the same between to two samples. Also, higher order bits in the mantissa go from "1" to "0". In this example, the four highest order bits of the mantissa are examined for this change. The change in lower order bits does not matter. Note that in this example, the do not care bits in the mantissa correspond to those in the lowest overlay.

Figure 11C:
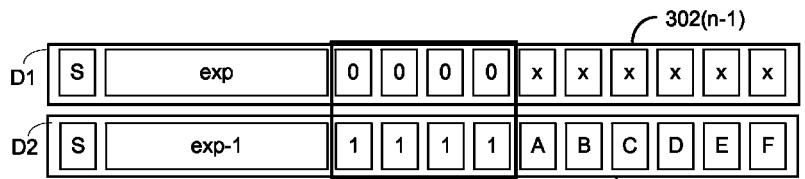
FIG. 11C shows an exponent down straddle case.

FIG. 11C shows an "exponent down" straddle case. Data sample, 302(n−1) is the previous data sample. Data sample, 302(n) is the new data sample. In this example, the exponent decreases by one. Also, the sign bit remains the same between to two samples. Also, higher order bits in the mantissa go from "0" to "1". In this example, the four highest order bits of the mantissa are examined for this change. The change in lower order bits does not matter. Note that in this example, the do not care bits in the mantissa correspond to those in the lowest overlay.

Figure 11D:
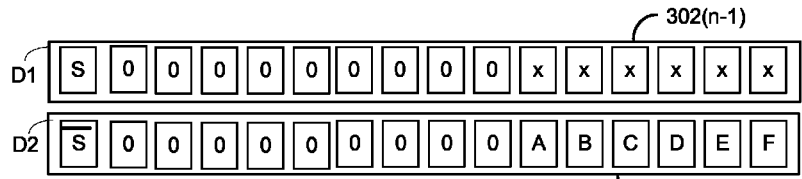
FIG. 11D shows a zero crossing straddle case.

FIG. 11D shows a "zero crossing" straddle case. Data sample, 302(n−1) is the previous data sample. Data sample, 302(n) is the new data sample. In this example, the exponent is zero for both cases. However, the sign bit switches (e.g., inverts) between the two samples. Also, the higher order bits in the mantissa stay at "0" In this example, the four highest order bits of the mantissa are examined. The change in lower order bits does not matter. Note that in this example, the do not care bits in the mantissa correspond to those in the lowest overlay.

Figure 11E:
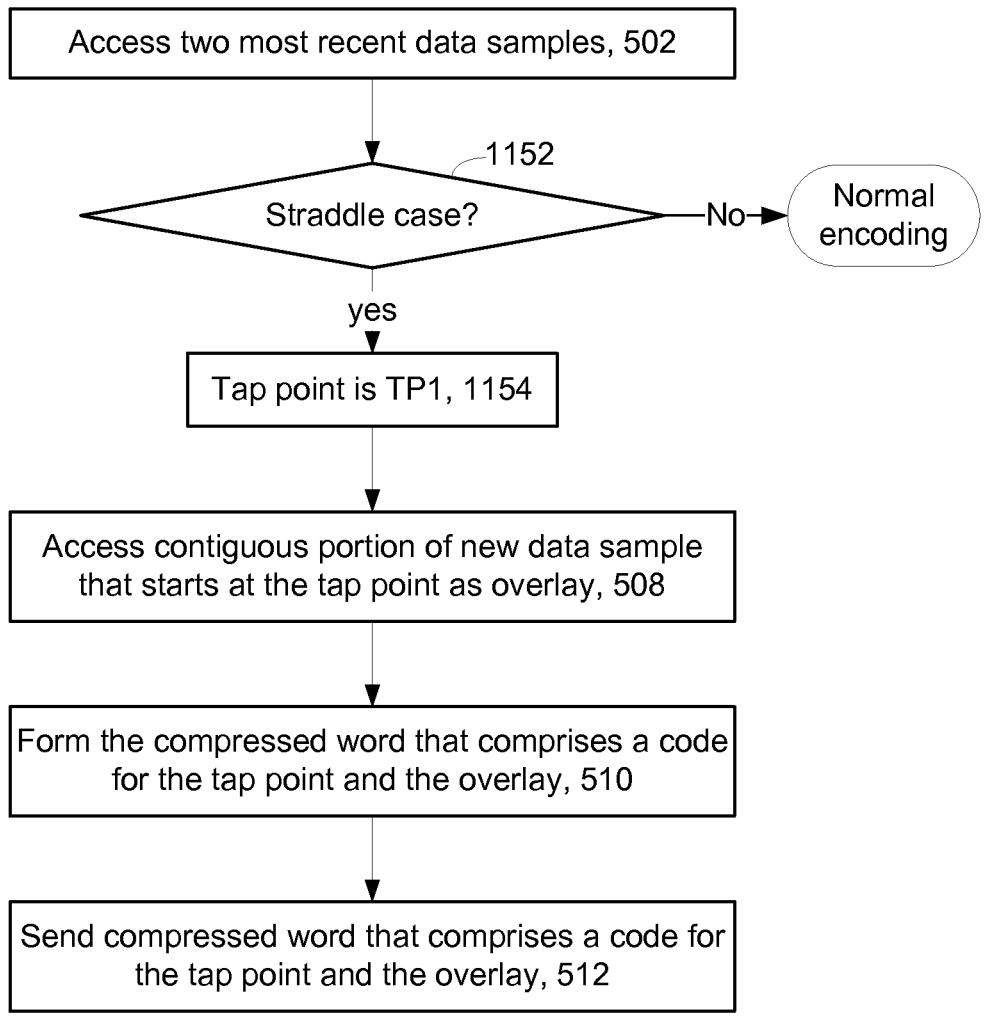
FIG. 11E is a flowchart of one embodiment of encoding to handle straddle cases.

FIG. 11E is a flowchart of one embodiment of encoding to handle straddle cases. In step 502, the encoder 402 accesses the two most recent data samples in an ordered sequence.

In step 1152, the encoder 402 determines whether this is a straddle case. FIG. 11B depicts an exponent up straddle case. The encoder 402 may detect this straddle case by determining the following: 1) the sign bit has not changed; 2) the exponent has incremented by one; and 3) the bits in the mantissa that are higher than the lowest overlay have flipped from all ones to all zeroes.

FIG. 11C depicts an exponent down straddle case. The encoder 402 may detect this straddle case by determining the following: 1) the sign bit has not changed; 2) the exponent has decremented by one; and 3) the bits in the mantissa that are higher than the lowest overlay have flipped from all zeroes to all ones.

FIG. 11D depicts a zero crossing straddle case. The encoder 402 may detect this straddle case by determining the following: 1) the sign bit has changed; 2) the exponent is all zeroes in both samples; and 3) the bits in the mantissa that are higher than the lowest overlay are all zeroes.

The encoder 402 may look for any or all of these straddle cases in step 1152. For example, in one embodiment, the encoder determines whether the exponent has changed between the two most recent data samples by exactly 1 and whether the bits in the mantissa that are higher than the "m" least significant bits (e.g., higher than the lowest overlay) have not changed between the two most recent data samples.

If the encoder 402 does not detect a straddle cases, then processing may be similar to FIG. 5A starting at step 504 or similar to FIG. 6A starting at step 604. If the encoder 402 does detect a straddle cases, then the encoder 402 selects tap point TP1 as the tap point, in step 1154.

Processing then continues with steps 508-512, which are similar to FIG. 5A. Note that regardless of the straddle case, the processing may be the same.

Figure 11F:
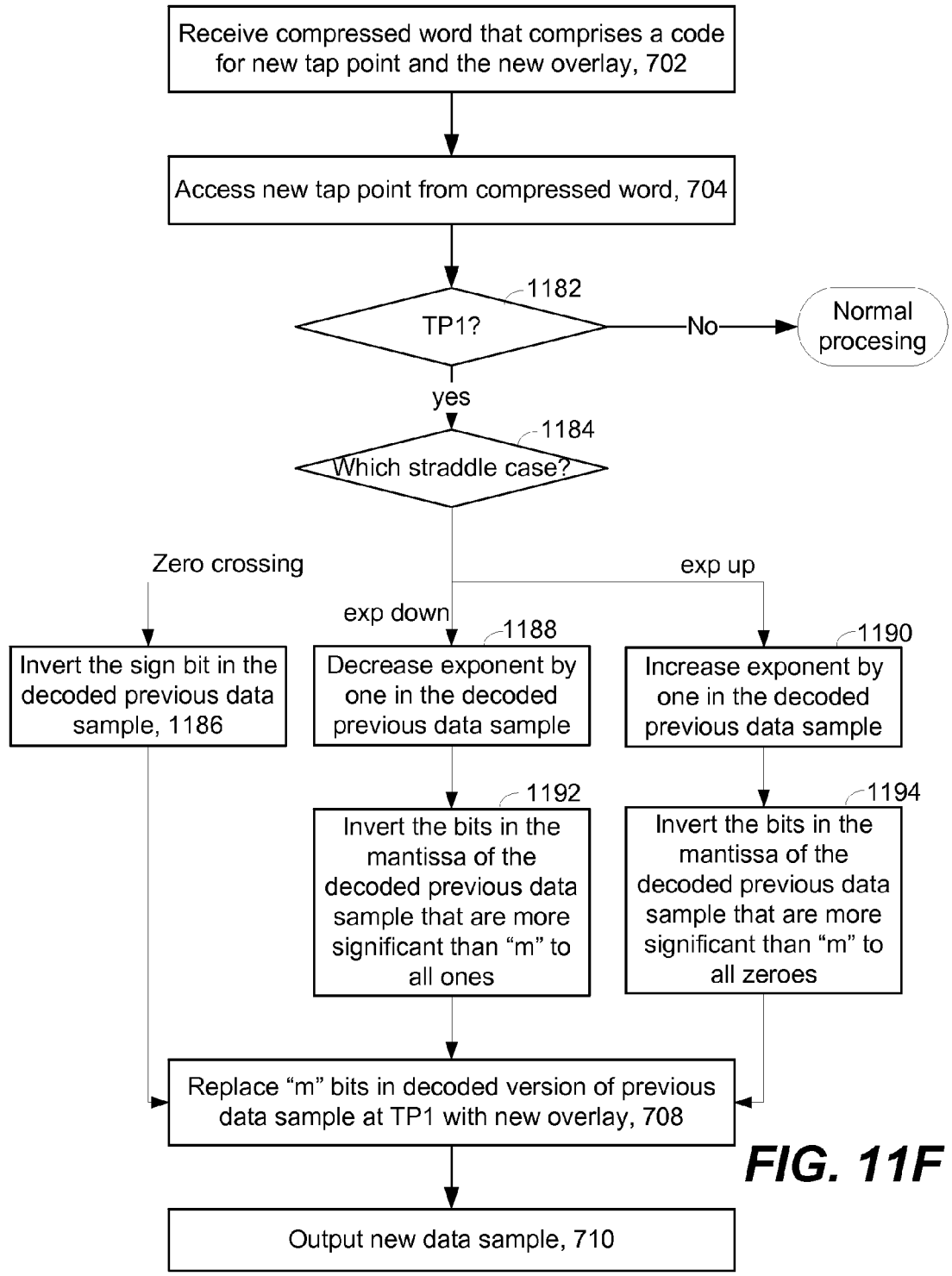
FIG. 11F is a flowchart of one embodiment of decoding to handle straddle cases.

FIG. 11F is a flowchart of one embodiment of decoding to handle straddle cases. This process may be used when encoding uses the process of FIG. 11E. In step 702, the decoder 404 receives a compressed word that comprises a new tap point and a new overlay. In step 704, the decoder accesses the new tap point from the compressed word.

The decoder 404 determines whether the tap point is TP1, in step 1182. This cues the decoder 404 that is a straddle case. If the tap point is not TP1, the normal processing of the tap point is performed. For example, the process of FIG. 7 may be used.

In the present example, there are three straddle cases. The decoder 404 determines which straddle case this is in step 1184. The decoder 404 may determine the straddle case by examining the previously decoded data sample.

The decoder 404 may determine that this is a zero crossing straddle case when the following condition(s) are met in the previous sample: 1) there are all zeroes in the exponent and the bits in the mantissa above the lowest overlay.

The decoder 404 may determine that this is an exponent up straddle case when the following condition(s) are met in the previous sample: 1) the bits in the mantissa above the lowest overlay were all ones in the previous data sample.

The decoder 404 may determine that this is an exponent down straddle case when the following conditions are met in the previous sample: 1) the bits in the mantissa above the lowest overlay were all zeroes in the previous data sample; and 2) the bits in the exponent were not all zeroes.

Note that there are numerous variations in which the decoder 404 checks for other combinations of the zero crossing, exponent down, and exponent up cases. The decoder 404 checks for the appropriate cases based on which cases the encoder 402 looked for.

The decoder 404 takes the appropriate step 1186, 1188, or 1190 based on the straddle case. If this is a zero crossing straddle case, then the decoder 404 inverts the sign bit in the previous decoded data sample, in step 1186. The process then goes to step 708 to replace the "m" bits the previous decoded data sample at TP1 with the overlay. The decoded data sample is then output by the decoder 404, in step 710.

If this is an exponent down case, then the decoder 404 decreases the exponent by 1 in the previous decoded data sample, in step 1188. Also, the decoder 404 inverts the bits in the mantissa of the previous decoded data sample that are higher than the overlay to all ones. Then, steps 708 and 710 are performed as previously described with respect to the zero crossing case.

If this is an exponent up case, then the decoder 404 increases the exponent by 1 in the previous decoded data sample, in step 1190. Also, the decoder 404 inverts the bits in the mantissa of the previous decoded data sample that are higher than the overlay to all zeroes. Then, steps 708 and 710 are performed as previously described with respect to the zero crossing case.

As previously mentioned, processing of other tap points does not require special handling. In this case, if the tap point is TP0, then the decoder 404 will replace the least significant "m" bits in the decoded previous data sample with the overlay without changing the most significant bit, without changing the exponent and without changing the bits in the mantissa that are above the "m" least significant bits.

Some samples may require special handling because they must be decoded losslessly. For example, error codes and special symbols must be decoded without bit error. In one embodiment, certain output codes that ordinarily would not be generated by the encoder 402 are used to send such special symbols.

Although some embodiments of data compression described herein may be lossy, a number of high-order bits (equal to the length of the overlay) are always correct at the decoder 404. If there is a second tap point in this region, then a code which selects the highest tap point but sends an overlay which does not change the data above the second tap point would not normally be generated by the encoder 402. Therefore, the decoder 404 can interpret this as a special symbol.

FIG. 12A is a diagram of a data sample 302 and compressed word 550 to illustrate one embodiment of encoding a special symbol. Note that the tap point TP2 is three bits lower than tap point TP3. To be consistent with other examples herein, the overlay is six bits. Therefore, note that TP2 is within the overlay of TP3.

The compressed word 550 includes the code for tap point TP3, as well as an overlay that repeats the three most significant bits (A, B, C). Normally, the encoder 402 would not select tap point TP3 and send an overlay that does not change any of the three most significant bits. In other words, given that the three most significant bits in the overlay 570 have not changed, normally the tap point would be tap point TP2 or lower. Note that selecting tap point TP2 could guarantee that bits all the way down to bit 7 are accurate. However, selecting tap point TP3 only guarantees that bits down to bit 10 are accurate. Therefore there is no advantage to selecting TP3 over TP2 unless at least one of bits A, B, or C have changed.

The decoder 404 interprets this situation in which TP3 is seemingly unnecessarily selected as indicating that a special symbol is being sent. Moreover, the three least significant bits in the overlay 570 may be used to differentiate between a number of special symbol. Note that these special symbols can be transmitted losslessly.

FIG. 12B is a flowchart of one embodiment of encoding a special symbol. In step 1201, the encoder 402 sends a compressed word for a data sample. The compressed word is such that at least the "m" most significant bits will be accurate. As before, "m" refers to the size of the overlay in bits.

In step 1202, the encoder 402 determines whether a special symbol should be transmitted in the next compressed word. This special symbol is one of a limited number of symbols that should be transmitted losslessly, in one embodiment. Step 1202 could include the encoder 402 recognizing that an error has occurred, and that some error code should be transmitted.

In step 1204, the encoder 402 accesses the code for the special symbol. For the sake of discussion, this code is "s" bits in length. In the example of FIG. 12A, "s" is three, but could be more or less than three, depending on the selection of the tap points.

In step 1206, the encoder selects tap point TP3 as the tap point. This is consistent with the example of FIG. 12A. However, the selected tap point depends on the implementation.

In step 1208, the encoder 402 accesses the "m-s" most significant bits of the previous data sample referred to in step 1201.

In step 1210, the encoder 402 forms the compressed word for the special symbol. In this example, the compressed word has the code for tap point TP3. Also, the "m-s" most significant bits in the overlay 570 are the "m-s" most significant bits from the data sample referred to in step 1201. The "s" least significant bits in the overlay are the code for the special symbol. The code for the special symbol starts at tap point TP2 in this example.

Figure 12C:
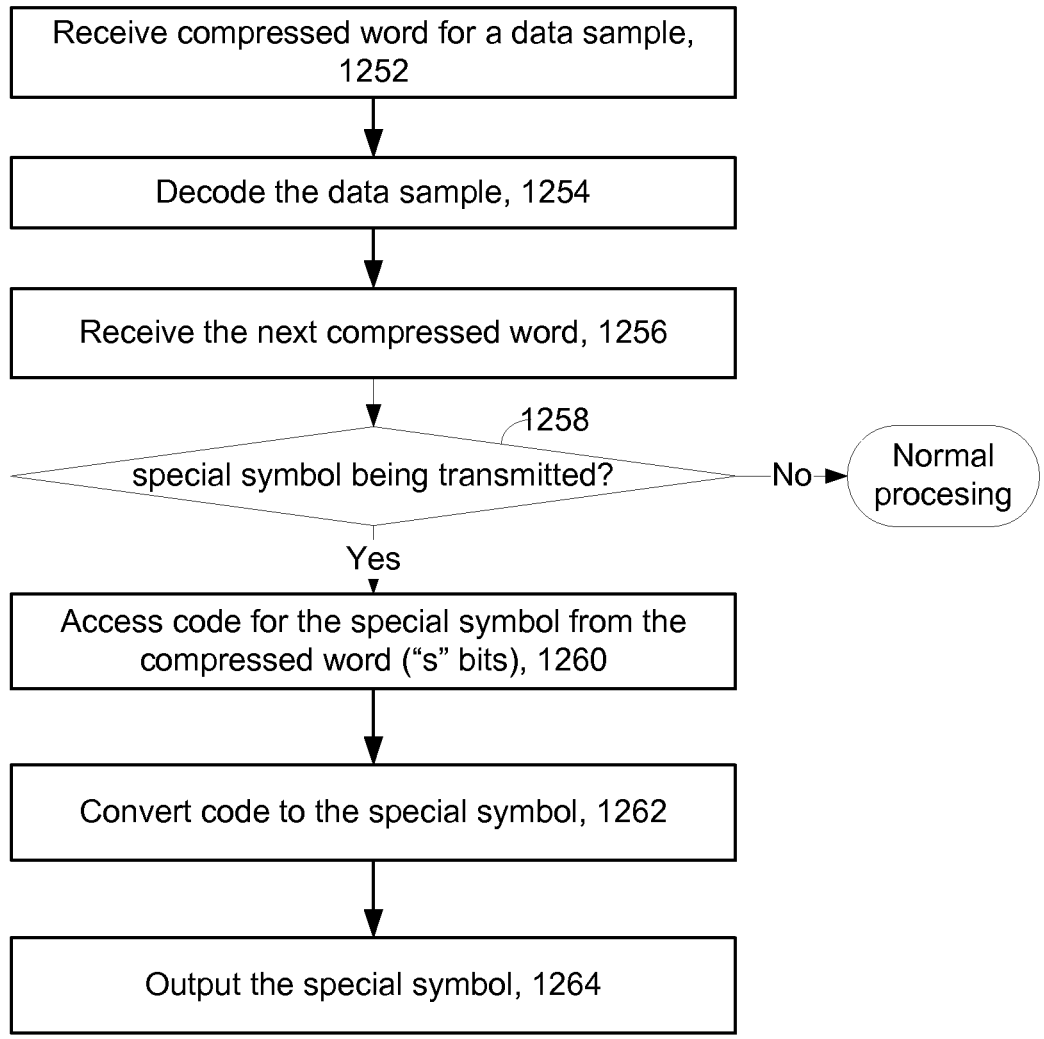
FIG. 12C is a flowchart of on embodiment of decoding a special symbol.

FIG. 12C is a flowchart of one embodiment of decoding a special symbol. In step 1252, the decoder 404 receives a compressed word for a data sample in an ordered sequence of data samples. In step 1254, the decoder 404 decodes the data sample. Examples of steps 1252 and 1254 have been discussed already. After step 1254, the decoder 404 has a decoded version of the data sample. This will be accurate for at least the "m" most significant bits, in one embodiment.

In step 1256, the decoder 404 receives the next compressed word immediately following the one from step 1252. This next compressed word corresponds to the next data sample in the ordered sequence of data samples.

In step 1258, the decoder 404 determines whether a special symbol is being transmitted in the compressed word. The decoder 404 may make this determination by noting whether the tap point is the highest tap point (TP3 in the present example) and whether none of the bits from the highest tap point up to but not including the next highest tap point have changed. For example, the decoder 404 compares the overlay 570 with the decoded version of the data sample from step 1254 to help make this determination. If this test is not met (step 1258=no), then the decoder 404 performs normal processing. If the test is met (step 1258=yes), then processing continues at step 1260.

In step 1260, the decoder 404 accesses the code for the special symbol from the overlay 570. In this example, the code may be a fixed length. That is, all of the codes may be the same number of bits. Thus, the decoder 404 may access the least significant "s" bits from the overlay 570. The decoder 404 may then determine the special symbol that the code in the overlay represents, in step 1262. Note that this special symbol is the same one that the encoder 402 worked with in one embodiment of FIG. 12B. The decoder 404 may then output the special symbol. Optionally, the decoder 404 then may process the special symbol. For example, the decoder 404 could convert the code for special symbol to an error code. Then, the decoder 404 could take action based on the error code, pass on the error code, etc.

In one embodiment, in the process of FIG. 12B, the encoder 402 looks for special symbols that should be transmitted losslessly. When it receives the special symbol, it sends TP3 (as one example) with the unchanged high-order bits and some code for the special symbol. In one embodiment of the process of FIG. 12C, the decoder 404 determines that the code for the special symbol corresponds to the special symbol that was received by the encoder 402 and outputs that special code.

FIG. 13 illustrates the functional components of a computing system 100 such as a multimedia console, depicting one computing environment in which aspects of the disclosure may be implemented. For example, the encoder 402 and/or the decoder 404 could be implemented in computing system 100. Note that a multimedia console is provided by way of example only as embodiments may be implemented in any general computer system including a processor and system memory.

Neither should the computing device be interpreted as having any dependency or requirement relating to any one or combination of components illustrated in the exemplary operating system. In some embodiments the various depicted computing elements may include circuitry configured to instantiate specific aspects of the present disclosure. For example, the term circuitry used in the disclosure can include specialized hardware components configured to perform function(s) by firmware or switches. In other examples embodiments the term circuitry can include a general purpose processing unit, memory, etc., configured by software instructions that embody logic operable to perform function(s). In example embodiments where circuitry includes a combination of hardware and software, an implementer may write source code embodying logic and the source code can be compiled into machine readable code that can be processed by the general purpose processing unit. The selection of hardware versus software to effectuate specific functions can be a design choice left to an implementer. More specifically, one of skill in the art can appreciate that a software process can be transformed into an equivalent hardware structure, and a hardware structure can itself be transformed into an equivalent software process. Thus, the selection of a hardware implementation versus a software implementation is one of design choice and left to the implementer.

The computing system 100 has a central processing unit (CPU) 101 having a level 1 cache 102, a level 2 cache 104, and a flash ROM (Read Only Memory) 106. The level 1 cache 102 and a level 2 cache 104 temporarily store data and hence reduce the number of memory access cycles, thereby improving processing speed and throughput. The CPU 101 may be provided having more than one core, and thus, additional level 1 and level 2 caches 102 and 104. The flash ROM 106 may store executable code that is loaded during an initial phase of a boot process when the system 100 is powered ON.

A graphics processing unit (GPU) 108 and a video encoder/video codec (not shown) form a video processing pipeline for high speed and high resolution graphics processing. Similarly, an audio processing unit (APU) 114 and audio encoder/audio codec (not shown) form an audio processing pipeline for high speed and high resolution audio processing. Data can be carried from the GPU 108 and APU 114 to the encoders/codecs via a bus. The video and audio processing pipelines output data to an A/V (audio/video) port 140 for transmission to a television or other display.

The computing system 100 includes an I/O controller 120, a system management controller 122, a network interface controller 124, a first USB host controller 126, a second USB controller 128 and a front panel I/O subassembly 130 that may be implemented on a module 118. The USB controllers 126 and 128 serve as hosts for peripheral controllers 142(1)-142(2), a wireless adapter 148, and an external memory device 146 (e.g., flash memory, external CD/DVD ROM drive, removable media, etc.). The network interface 124 and/or wireless adapter 148 provide access to a network (e.g., the Internet, home network, etc.) and may be any of a wide variety of various wired or wireless interface components including an Ethernet card, a modem, a Bluetooth module, a cable modem, and the like.

Computing system 100 may include a variety of computer readable media. Computer readable media can be any available media that can be accessed by computing system 100 and includes both volatile and nonvolatile media, removable and non-removable media. By way of example, and not limitation, computer readable media may comprise computer readable storage media and communication media. Computer readable storage media includes volatile and nonvolatile, as well as removable and non-removable media implemented in any method or technology for storage of information such as computer readable instructions, data structures, program modules or other data. Computer readable storage media includes, but is not limited to, random access memory (RAM), read only memory (ROM), EEPROM, flash memory or other memory technology, CD-ROMs, digital versatile discs (DVDs) or other optical disc storage, magnetic cassettes, magnetic tapes, magnetic disc storage or other magnetic storage devices, or any other medium which can be used to store the information and which can be accessed by computing device 100. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

Non-volatile memory 143, e.g., flash memory, is provided to store application data that is loaded during the boot process. A media drive 144 is provided and may comprise a DVD/CD drive, hard drive, or other removable media drive, etc. The media drive 144 may be internal or external to the computing system 100. Application data may be accessed via the media drive 144 for execution, playback, etc. by the multimedia console 100. The media drive 144 is connected to the I/O controller 120 via a bus, such as a Serial ATA bus or other high speed connection (e.g., IEEE 1394).

The system management controller 122 provides a variety of service functions related to assuring availability of the computing system 100. The front panel I/O subassembly 130 supports the functionality of the power button 150 and the eject button 152, as well as any LEDs (light emitting diodes) or other indicators exposed on the outer surface of the computing system 100. A system power supply module 136 provides power to the components of the computing system 100. A fan 138 cools the circuitry within the computing system 100.

The CPU 101, GPU 108, controller 110, and various other components within the computing system 100 are interconnected via one or more buses, including serial and parallel buses, a memory bus, a peripheral bus, and a processor or local bus using any of a variety of bus architectures.

When the computing system 100 is powered ON, application data may be loaded from the non-volatile memory 143 into memory 112 and/or caches 102, 104 and executed on the CPU 101. The application may present a graphical user interface that provides a consistent user experience when navigating to different media types available on the multimedia console 100. In operation, applications and/or other media contained within the media drive 144 may be launched or played from the media drive 144 to provide additional functionalities to the computing system 100.

The computing system 100 may be operated as a standalone system by simply connecting the system to a television or other display. In this standalone mode, the computing system 100 allows one or more users to interact with the system, watch movies, or listen to music. However, with the integration of broadband connectivity made available through the network interface 124 or the wireless adapter 148, the computing system 100 may further be operated as a participant in a larger network community.

A controller 110 is connected to the CPU 101, GPU 108 and APU 114 to facilitate access and management of system memory 112. Controller 110 may include hardware and/or software for accessing system memory 112. For example, an implementation may include one or more standalone MMU (memory management units) implemented as part of CPU 101 in one example. Controller 110 may include hardware-based memory controllers. Software-based implementations may include a controller incorporated within the operating system provided by CPU 101, for example. An MMU is provided in the operating system layer of the computing system in one example. System memory 112 may include but is not limited to, RAM (Random Access Memory) such as DRAM (Dynamic RAM). The controller may be responsible for handling memory access requests associated with the various processors. Other functions performed by the controller may include the translation of virtual addresses to physical addresses (i.e., virtual memory management), memory protection, cache control, and so on.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system comprising:
    a first interface to access a first data sample having "n" bits ordered from a most significant bit to a least significant bit and to access a second data sample having "n" bits ordered from a most significant bit to a least significant bit, wherein the second data sample is the next data sample after the first data sample in an ordered sequence of data samples;
    first logic to determine the highest-order bit, if any, that is different between the first data sample and the second data sample;
    second logic to determine a tap point that is a specific bit of the "n" bits, wherein the tap point is one of a number of permitted starting points for an overlay of "m" bits, wherein the tap point corresponds to a bit whose order is at least as high as the highest-order bit that is different between the first and second data samples, wherein the tap points are positioned such that all "n" bits fall within at least one overlay;
    third logic to access a portion of the second data sample comprising "m" contiguous bits, wherein the portion starts at the tap point and includes bits towards the least significant bit, wherein the portion is an overlay for the second data sample, wherein the third logic is operable to form a compressed word for the second data sample that comprises the portion of the second data sample in association with a code that indicates the tap point; and
    a second interface to output the compressed word for the second data sample.

2. The system of claim 1, wherein the second logic is operable to encode the tap point using "e" bits, wherein $(2^e \times m) \geq n$.

3. The system of claim 1, wherein the first interface is operable to access a third data sample having "n" bits ordered from a most significant bit to a least significant bit, wherein the third data sample is the next data sample after the second data sample in the ordered sequence of data samples, wherein the first logic is operable to determine the highest-order bit that is different between the second data sample and the third data sample, wherein the second logic is operable to determine a provisional tap point that corresponds to a bit whose order is at least as high as the highest-order bit that is different between the second data sample and the third data sample, wherein the second logic is operable to determine a lowest permitted tap point for a compressed word for the third data sample, wherein the lowest permitted tap point includes the highest-order bit that was not sent in the compressed word for the second data sample, wherein the second logic is operable to determine a final tap point that is the highest tap point of the provisional tap point and the lowest permitted tap point, wherein the third logic is operable to access an "m" bit contiguous portion of the third data sample that starts at the final tap point and includes bits towards the least significant bit, wherein the second interface is operable to output a compressed word for the third data sample, wherein the compressed word comprises the "m" bit contiguous portion of the third data sample in association with a code that indicates the final tap point.

4. The system of claim 1, further comprising:
    decoder logic to receive the compressed word for the second data sample, wherein the decoder logic is operable to access the tap point from the compressed word, wherein the decoder logic is operable to determine a start point for the overlay for the second data sample based on the tap point, wherein the decoder logic is operable to replace "m" contiguous bits in a decoded version of the first data sample starting at the start point for the overlay for the second data sample with the portion of the second data sample from the compressed word for the second data sample in order to generate a decoded version of the second data sample, wherein the decoder logic is operable to output the decoded version of the second data sample.

5. The system of claim 1, wherein the most significant bit of the first data sample and the second data sample is a sign bit, wherein a first tap point and a second tap point are each assigned to a bit location "m−1" bits higher than the least significant bit, wherein the second logic to determine the tap point that is a specific bit of the "n" bits is further operable to:
    select the first tap point as the tap point for the second data sample when the most significant bit that has changed between the first data sample and the second data sample is in the lowest "m" bits; and
    select the second tap point as the tap point for the second data sample when the sign bit has changed between the first data sample and the second data sample and when the most significant bit, other than the sign bit, that has changed between the first data sample and the second data sample is in the lowest "m" bits.

6. The system of claim 1, wherein the first data sample and the second data sample are formatted as floating point numbers having a sign at the most significant bit, an exponent at the next most significant "p" bits, and a mantissa for remaining lower-order bits, wherein a first tap point and a second tap point are each assigned to a bit location "m−1" bits higher than the least significant bit, wherein the second logic that is operable to determine the tap point that is a specific bit of the "n" bits is further operable to:
  select the first tap point in response to determining that the exponent has changed between the first data sample and the second data sample by exactly 1 and that the bits in the mantissa that are higher than the "m" least significant bits have all changed between the first data sample and the second data sample.

7. The system of claim 1, wherein a first tap point is the highest tap point and a second tap point is the second highest tap point, wherein the second tap point is within "m−1" bits of the first tap point, and further comprising:
  fourth logic to determine that a special symbol that should be decoded without bit error is to be provided by the second interface immediately following providing the compressed word for the second data sample, wherein the fourth logic is operable to access a code for the special symbol, wherein the code for the special symbol is "s" bits;
  wherein the second logic to determine the tap point is operable to select the first tap point to transmit the special symbol; and
  wherein the second interface is operable to provide a compressed word for the special symbol, wherein the compressed word comprises an overlay that has at the most significant "m−s" bits the same bits as were sent in the compressed word for the second data sample followed by the "s" bits for the code for the special symbol at the second tap point.

8. A method comprising:
  accessing, at an encoder, a first data sample having "n" bits ordered from a most significant bit to a least significant bit;
  accessing, at the encoder, a second data sample having "n" bits ordered from a most significant bit to a least significant bit, wherein the second data sample is the next data sample after the first data sample in an ordered sequence of data samples;
  determining, by the encoder, the highest-order bit that is different between the first data sample and the second data sample;
  selecting, by the encoder, a tap point that is a specific bit of the "n" bits, wherein the tap point is one of a number of permitted starting points for an overlay of "m" bits, wherein the tap point corresponds to a bit whose order is at least as high as the highest-order bit that is different between the first and second data samples, wherein the tap points are arranged such that all "n" bits fall within at least one overlay, wherein the overlay is "m" bits;
  accessing, by the encoder, an "m" bit contiguous portion of the second data sample that starts at the tap point and moves towards the least significant bit, wherein the contiguous portion is an "m" bit overlay for the second data sample (508); and
  providing, from the encoder to a decoder, a compressed word for the second data sample, wherein the compressed word comprises the "m" bit overlay for the second data sample in association with a code that indicates the tap point (510).

9. The method of claim 8, further comprising encoding the tap point using "e" bits, wherein $(2^e \times m) \geq n$.

10. The method of claim 8, further comprising:
  accessing a third data sample having "n" bits ordered from a most significant bit to a least significant bit, wherein the third data sample is the next data sample after the second data sample in the ordered sequence of data samples;
  determining, by the encoder, the highest-order bit that is different between the second data sample and the third data sample;
  determining, by the encoder, a provisional tap point that corresponds to a bit whose order is at least as high as the highest-order bit that is different between the second data sample and the third data sample;
  determining, by the encoder, a lowest permitted tap point for a compressed word for the third data sample, wherein the lowest permitted tap point includes the highest-order bit that was not sent in the compressed word for the second data sample;
  determining, by the encoder, a final tap point that is the higher tap point of the provisional tap point and the lowest permitted tap point;
  accessing, by the encoder, a contiguous portion of the third data sample that starts at the final tap point and moves towards the least significant bit; and
  providing, from the encoder to the decoder, a compressed word for the third data sample, wherein the compressed word comprises the contiguous portion of the third data sample in association with a code that indicates the final tap point.

11. The method of claim 8, further comprising:
  receiving, at the decoder, the compressed word for the second data sample;
  accessing, by the decoder, the tap point from the compressed word for the second data sample;
  determining, by the decoder, a start point for the overlay for the second data sample based on the tap point; and
  replacing, by the decoder, "m" contiguous bits in a decoded version of the first data sample starting at the start point with the "m" bit overlay for the second data sample.

12. The method of claim 8, wherein two of the tap points represent adjacent bits of the "n" bits, and further comprising:
  receiving, at the decoder, the compressed word for the second data sample;
  accessing, by the decoder, the tap point from the compressed word for the second data sample;
  determining, by the decoder, that the tap point from the compressed word for the second data sample represents a bit that is one bit higher than another possible tap point;
  determining, by the decoder, that the starting point for the overlay for the second data sample is one bit below the tap point from the compressed word for the second data sample;
  replacing, by the decoder, "m" bits in a decoded version of the first data sample starting one bit below the tap point for the second data sample with the "m" bit overlay for the second data sample;
  inverting, by the decoder, the bit in the decoded version of the first data sample that is at the tap point for the second data sample; and outputting as the decoded version of the second data sample, by the decoder, the decoded version of the first data sample with the inverted bit and with the "m" replaced bits.

13. The method of claim 8, wherein the most significant bit of the first data sample and the second data sample is a sign bit, wherein a first tap point and a second tap point are each assigned to a bit location "m−1" bits higher than the least significant bit, wherein the determining, by the encoder, a tap point that is a specific bit of the "n" bits comprises:
   selecting, by the encoder, the second tap point as the tap point for the second data sample in response to determining that the most significant bit in the second data sample is "1" and that the next most significant bit that has changed between the first data sample and the second data sample is one of the lowest "m" bits; and
   selecting, by the encoder, the first tap point as the tap point for the second data sample in response to determining that the most significant bit in second data sample is "0" and that the next most significant bit that has changed between the first data sample and the second data sample is one of the lowest "m" bits.

14. The method of claim 8, wherein the first data sample and the second data sample are formatted as floating point numbers having a sign at the most significant bit, an exponent at the next most significant "p" bits, and a mantissa for remaining lower-order bits, wherein a first tap point and a second tap point are each assigned to a bit location "m−1" bits higher than the least significant bit, further comprising:
   selecting, by the encoder, the first tap point in response to determining that the exponent has changed between the first data sample and the second data sample by exactly 1 and that the bits in the mantissa that are higher than the first tap point have all changed between the first data sample and the second data sample; and
   selecting, by the encoder, the first tap point in response to determining that the most significant bit has changed between the first data sample and the second data sample, the exponent is zero in both the first data sample and the second data sample, and the bits in the mantissa that are higher than the first tap point are zero in both the first data sample and the second data sample.

15. An apparatus comprising:
   decoder logic that is operable to receive a compressed word for a first data sample from an encoder and is operable to decode the first data sample to produce a decoded version of the first data sample, wherein the decoder logic is further operable to receive a compressed word for a second data sample from the encoder, wherein the second data sample is the next data sample after the first data sample in an ordered sequence of data samples, wherein the compressed word for the second data sample comprises a code for a tap point for the second data sample and "m" contiguous bits of the second data sample, wherein the first and second data samples when decoded each have "n" bits ordered from a most significant bit to a least significant bit, wherein the tap point is a specific bit of the "n" bits, wherein the tap point is one of a number of permitted starting points for an overlay of "m" bits, wherein the tap point corresponds to a bit whose order is at least as high as the highest-order bit that is different between the first and second data samples, wherein the tap points are positioned such that all "n" bits fall within at least one overlay, wherein the decoder logic is operable to accesses the tap point and the overlay from the compressed word for the second data sample, wherein the decoder logic is operable to determine a start point for the overlay for the second data sample based on the tap point, wherein the decoder logic is operable to replace "m" contiguous bits in the decoded version of the first data sample starting at the start point for the overlay for the second data sample with the "m" contiguous bits of the second data sample from the compressed word for the second data sample in order to generate a decoded version of the second data sample, wherein the decoder logic is operable to output the decoded version of the second data sample.

16. The apparatus of claim 15, wherein the decoder logic is further operable to replace all bits below the "m" contiguous bits in the decoded version of the first data sample with a set of bits that reduces the maximum error in the decoded version of the second data sample.

17. The apparatus of claim 15, wherein two of the tap points represent adjacent bits of the "n" bits, wherein the decoder logic is further operable to:
   receive a compressed word for a third data sample, wherein the third data sample follows the second data sample in the ordered sequence of data samples, wherein the compressed word for the third data sample comprises a code for a tap point for the third data sample and an "m" bit contiguous portion of the third data sample;
   access the tap point from the compressed word for the third data sample;
   determine that the tap point from the compressed word for the third data sample represents a bit that is one bit above another possible tap point;
   determine that the start point for the overlay for the third data sample is one bit below the tap point from the compressed word for the third data sample;
   replace "m" bits in the decoded version of the second data sample starting one bit below the tap point for the third data sample with the contiguous portion of the third data sample from the compressed word for the third data sample;
   invert the bit in the decoded version of the second data sample that is at the tap point for the third data sample; and
   output, as a decoded version of the third data sample, the decoded version of the second data sample with the inverted bit at the tap point for the third data sample and with the "m" bits replaced starting one bit below the tap point for the third data sample.

18. The apparatus of claim 15, wherein the decoder logic is further operable to:
   receive a compressed word for a third data sample, wherein the third data sample follows the second data sample in the ordered sequence of data samples, wherein the compressed word for the third data sample comprises a code for a tap point for the third data sample and a contiguous portion of the third data sample, wherein the most significant bit of the first, second, and third data samples is a sign bit, wherein a first tap point and a second tap point are each assigned to a bit location "m−1" bits higher than the least significant bit;
   when the tap point for the third data sample is the first tap point, invert the most significant bit in the decoded second data sample and replace the least significant "m" bits in the decoded second data sample with the contiguous portion of the third data sample in order to generate a decoded version of the third data sample;
   when the tap point for the third data sample is the second tap point, keep the most significant bit the same in the decoded second data sample and replace the least significant "m" bits in the decoded second data sample with the contiguous portion of the third data sample in order to generate a decoded version of the third data sample; and output the decoded version of the third data sample.

19. The apparatus of claim 15, wherein the decoder logic is further operable to:
receive a compressed word for a third data sample, wherein the third data sample follows the second data sample in the ordered sequence of data samples, wherein the compressed word for the third data sample comprises a code for a tap point for the third data sample and a contiguous portion of the third data sample, wherein the first, second, and third data samples are formatted as floating point numbers having a sign at the most significant bit, an exponent at the next most significant "p" bits, and a mantissa for remaining lower-order bits, wherein a first tap point and a second tap point are each assigned to a bit location "m−1" bits higher than the least significant bit;
when the tap point for the third data sample is the first tap point and the exponent of the decoded second data sample is zero and when bits in the mantissa of the decoded second data sample that are more significant than "m" bits are all zero, invert the most significant bit of the decoded second data sample in order to generate a decoded version of the third data sample;
when the tap point for the third data sample is the first tap point and the exponent of the decoded second data sample is non-zero and when bits in the mantissa of the decoded second data sample that are more significant than "m" bits are all zero, decrease the exponent by 1 in the decoded second data sample, invert the bits in the mantissa of the decoded second data sample that are more significant than "m" to all ones, and replace the least significant "m" bits in the decoded second data sample with the contiguous portion of the third data sample in order to generate a decoded version of the third data sample;
when the tap point for the third data sample is the first tap point and when bits in the mantissa of the decoded second data sample that are more significant than "m" bits are all ones, increase the exponent by 1 in the decoded second data sample, invert the bits in the mantissa of the decoded second data sample that are more significant than "m" to all zeros, and replace the least significant "m" bits in the decoded second data sample with the contiguous portion of the third data sample in order to generate a decoded version of the third data sample; and
when the tap point for the third data sample is the second tap point, replace the least significant "m" bits in the decoded second data sample with the contiguous portion of the third data sample without changing the most significant bit, without changing the exponent, and without changing the bits in the mantissa that are above the "m" least significant bits in order to generate a decoded version of the third data sample.

20. The apparatus of claim 15, wherein a first tap point is the highest tap point and a second tap point is the second highest tap point, wherein the second tap point is within "m−1" bits of the highest tap point, wherein the decoder logic is further operable to:
receive a compressed word for a special symbol immediately following the compressed word for the second data sample, wherein the compressed word for the special symbol comprises a code for the first tap point and an overlay of "m" bits, wherein the overlay comprises "s" bits of a code for the special symbol;
determine whether the most significant "m−s" bits of the overlay are the same as the most significant "m−s" bits in the decoded second data sample;
in response to determining that the most significant "m−s" bits of the overlay are the same as the most significant "m−s" bits in the decoded second data sample, determine that the least significant "s" bits in the overlay are a code for the special symbol;
determine the special symbol based on the code for the special symbol; and
output the special symbol.

\* \* \* \* \*